United States Patent
Long et al.

(10) Patent No.: US 10,833,928 B1
(45) Date of Patent: Nov. 10, 2020

(54) EXCHANGING INFORMATION AMONG SYSTEM MIDDLEWARE AND MODELS

(71) Applicant: The MathWorks, Inc., Natick, MA (US)

(72) Inventors: Xianchao Long, Worcester, MA (US); Justyna Zander, Framingham, MA (US); David Koh, Boston, MA (US); Gautam K. Vallabha, Framingham, MA (US); Pieter J. Mosterman, Framingham, MA (US)

(73) Assignee: The MathWorks, Inc., Natick, MA (US)

( * ) Notice: Subject to any disclaimer, the term of this patent is extended or adjusted under 35 U.S.C. 154(b) by 0 days.

(21) Appl. No.: 16/169,177

(22) Filed: Oct. 24, 2018

Related U.S. Application Data

(63) Continuation of application No. 14/635,719, filed on Mar. 2, 2015, now Pat. No. 10,116,500.

(51) Int. Cl.
*H04L 12/24* (2006.01)

(52) U.S. Cl.
CPC .............................. *H04L 41/0806* (2013.01)

(58) Field of Classification Search
None
See application file for complete search history.

(56) References Cited

U.S. PATENT DOCUMENTS

| | | |
|---|---|---|
| 7,490,032 B1 * | 2/2009 | Koh |
| 8,046,201 B1 | 10/2011 | Pike et al. |
| 10,116,500 B1 | 10/2018 | Long et al. |
| 2006/0139372 A1 | 6/2006 | Orofino, II |
| 2008/0052425 A1 * | 2/2008 | Orofino, II |

OTHER PUBLICATIONS

"Common Object Request Broker Architecture (CORBA)," OMG: Object Management Group, <http://www.omg.org/spec/CORBA/3.3/>, Nov. 12, 2012, 532 pages.
"Composite structure diagram," Wikipedia, <https://en.wikipedia.org/wiki/Composite_structure_diagram>, May 15, 2016, 2 pages.
"Data Distribution Service for Real-time Systems," OMG: Object Management Group, Jul. 1, 2001, 260 pages.
"HLA Blockset: The Simulink interface to HLA," FORWARDSIM: simulations & technologies, Mar. 2014, 2 pages.
Notification of Transmittal of the International Search Report and the Written Opinion of the International Searching Authority, or the Declaration, corresponding to PCT/US2016/064098 dated May 18, 2018, pp. 1-16.

(Continued)

*Primary Examiner* — Syed A Roni
(74) *Attorney, Agent, or Firm* — Cesari and McKenna, LLP; Michael R. Reinemann

(57) ABSTRACT

A device generates a block for a model associated with a system, and the system is associated with middleware. The block subscribes to information generated by the middleware based on communication between the middleware and the system. The device receives subscriber configuration information for configuring the block, and creates, based on the subscriber configuration information, a signal that converts the information generated by the middleware into a format compatible with the model.

23 Claims, 13 Drawing Sheets

(56) References Cited

OTHER PUBLICATIONS

"The OSGi Architecture," OSGi Alliance, <http://www.osgi.org/Technology/WhatIsOSGi>, Aug. 13, 2008, 4 pages.
"Polymorphism," University of Texas, <http://cs.utexas.ed/~mitra/csSummer2012/cs312/lectures/interfaces.html>, Nov. 26, 2003, 2 pages.
"ROS I/O Package: Getting Started Guide," R2014a, The MathWorks, Inc., Mar. 2014, pp. 1-28.
Shakeri, et al., copy of co-pending U.S. Appl. No. 15/298,019, entitled "Port Management for Graphical Modeling", filed Oct. 19, 2016, 72 pages.
"Simulink Model-Based Design and System-Based Design—Using Simulink Version 5", The Math Works, Inc., Oct. 5, 2014, XP002410179, pp. 4-48.
Ulusoy, et al., copy of co-pending U.S. Appl. No. 15/060,019, entitled "Automatic Grouping of Signals of a Model", filed Mar. 3, 2016, 72 pages.
"UML 2.0—Overview," Tutorialspoint, <https://www.tutorialspoint.com/uml/uml_2_overview.htm>, Feb. 20, 2009, 7 pages.
Xiong et al., "HLA Based Collaborative Simulation with MATLAB Seamlessly Embedded," International Journal for Machine Learning and Computing, vol. 2, No. 2, Apr. 2012, 8 pages.

\* cited by examiner

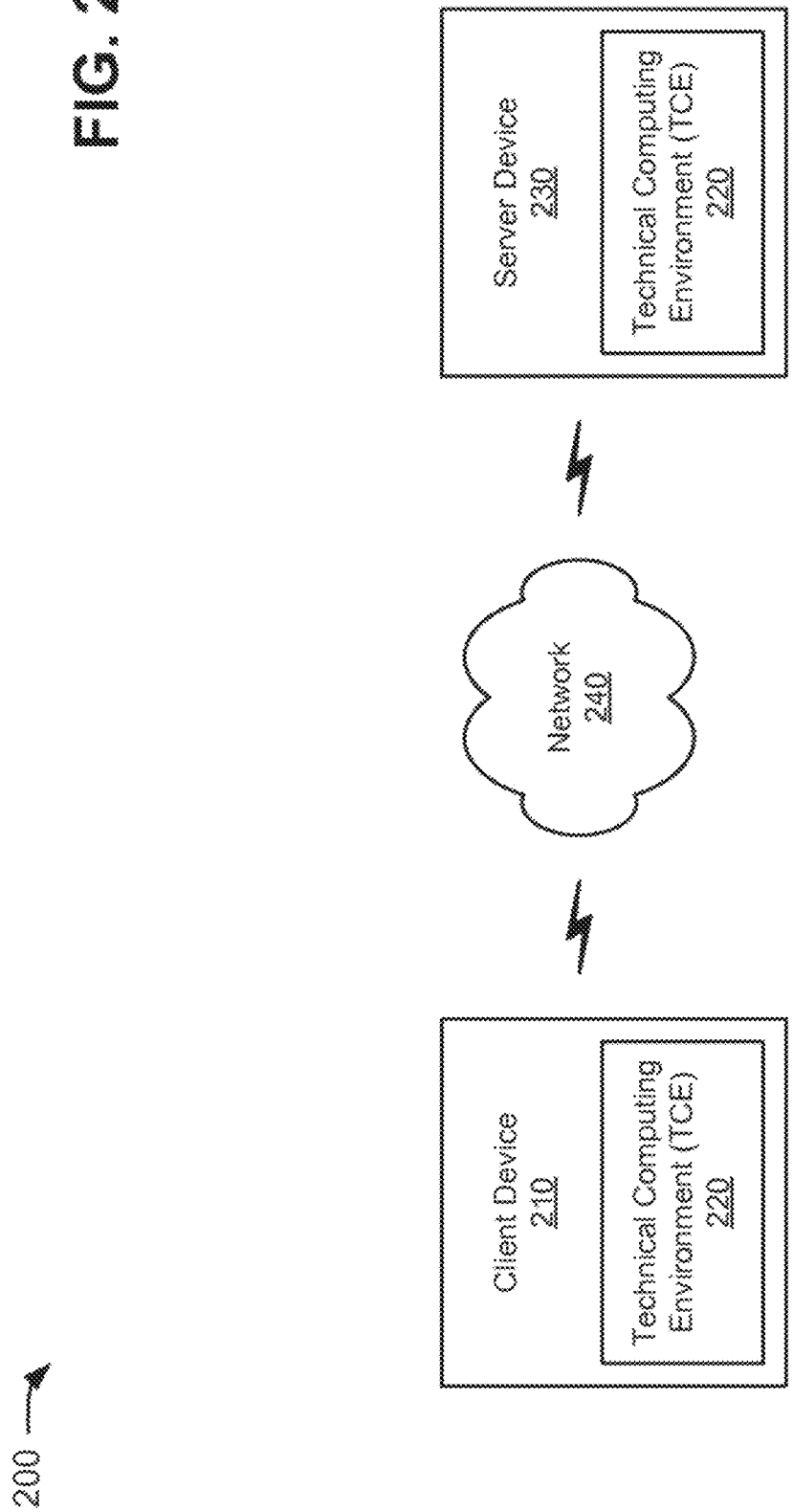

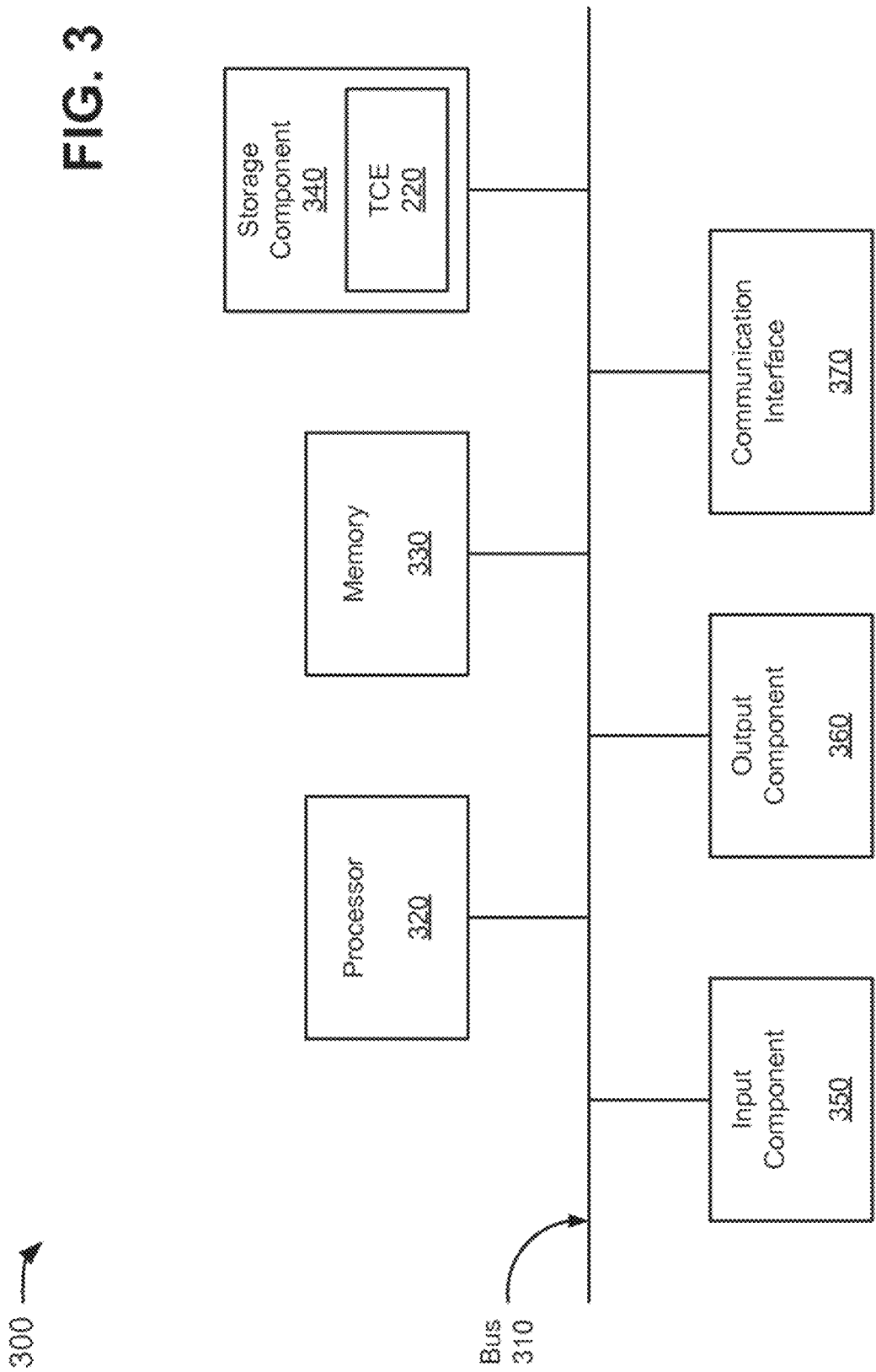

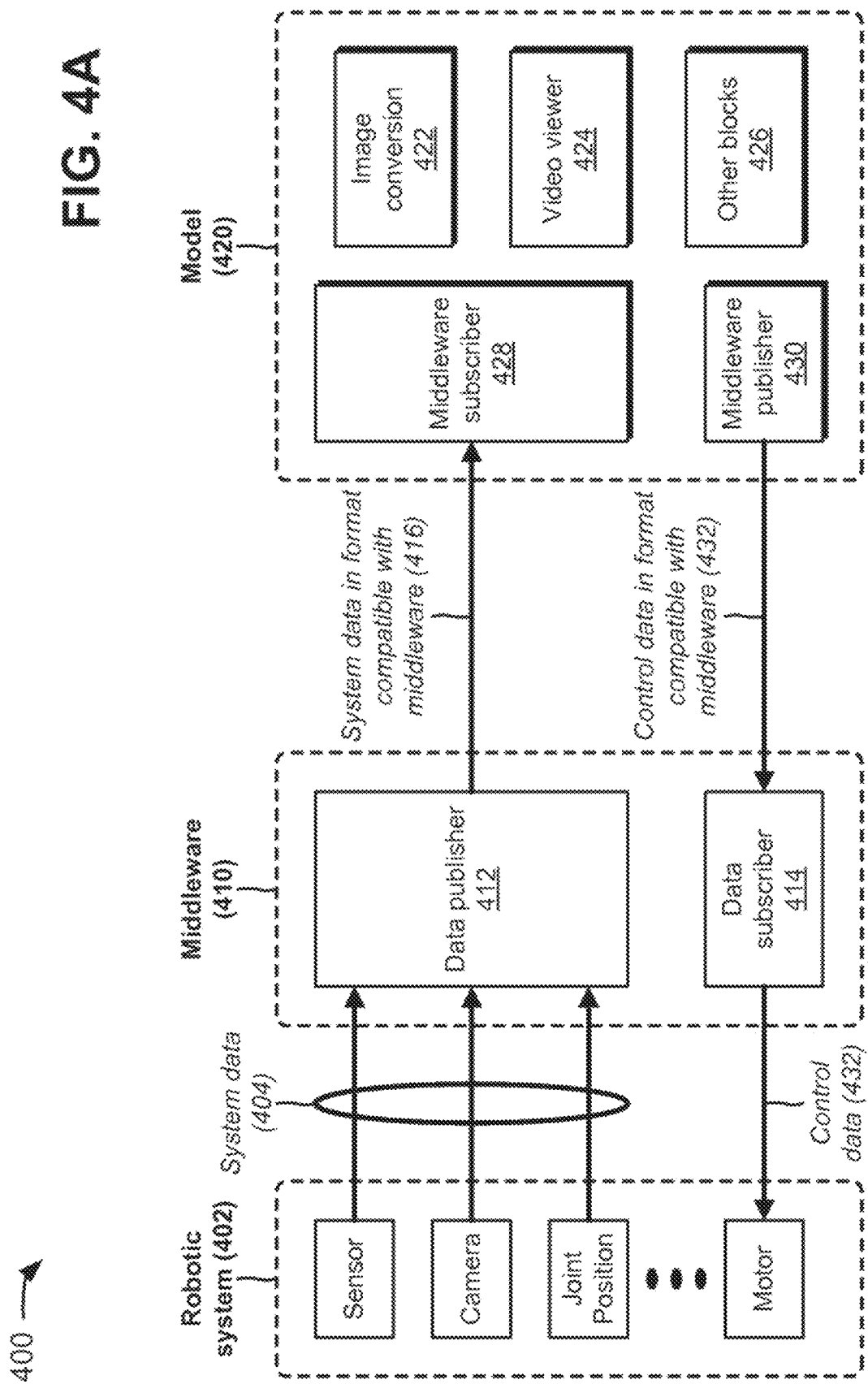

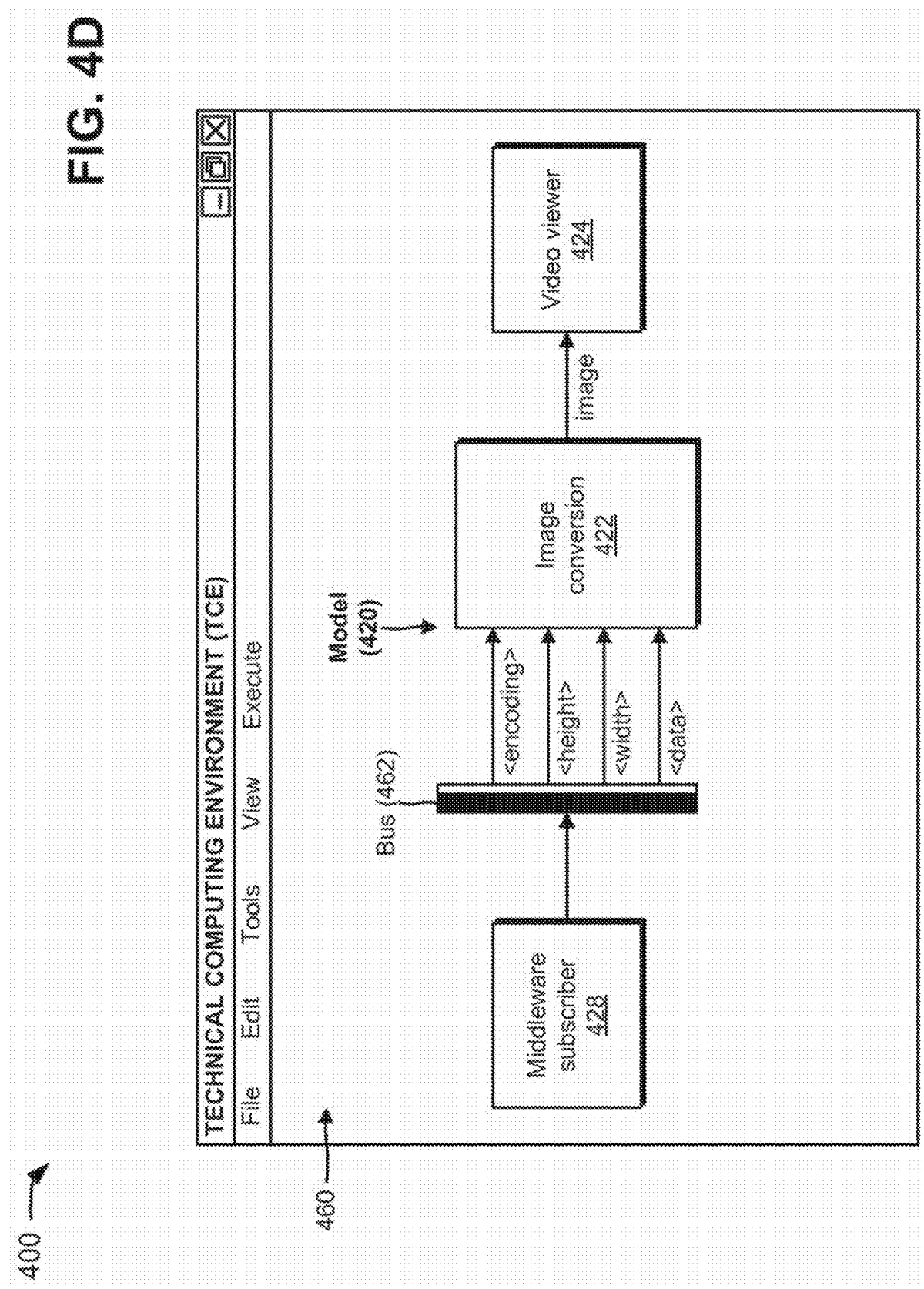

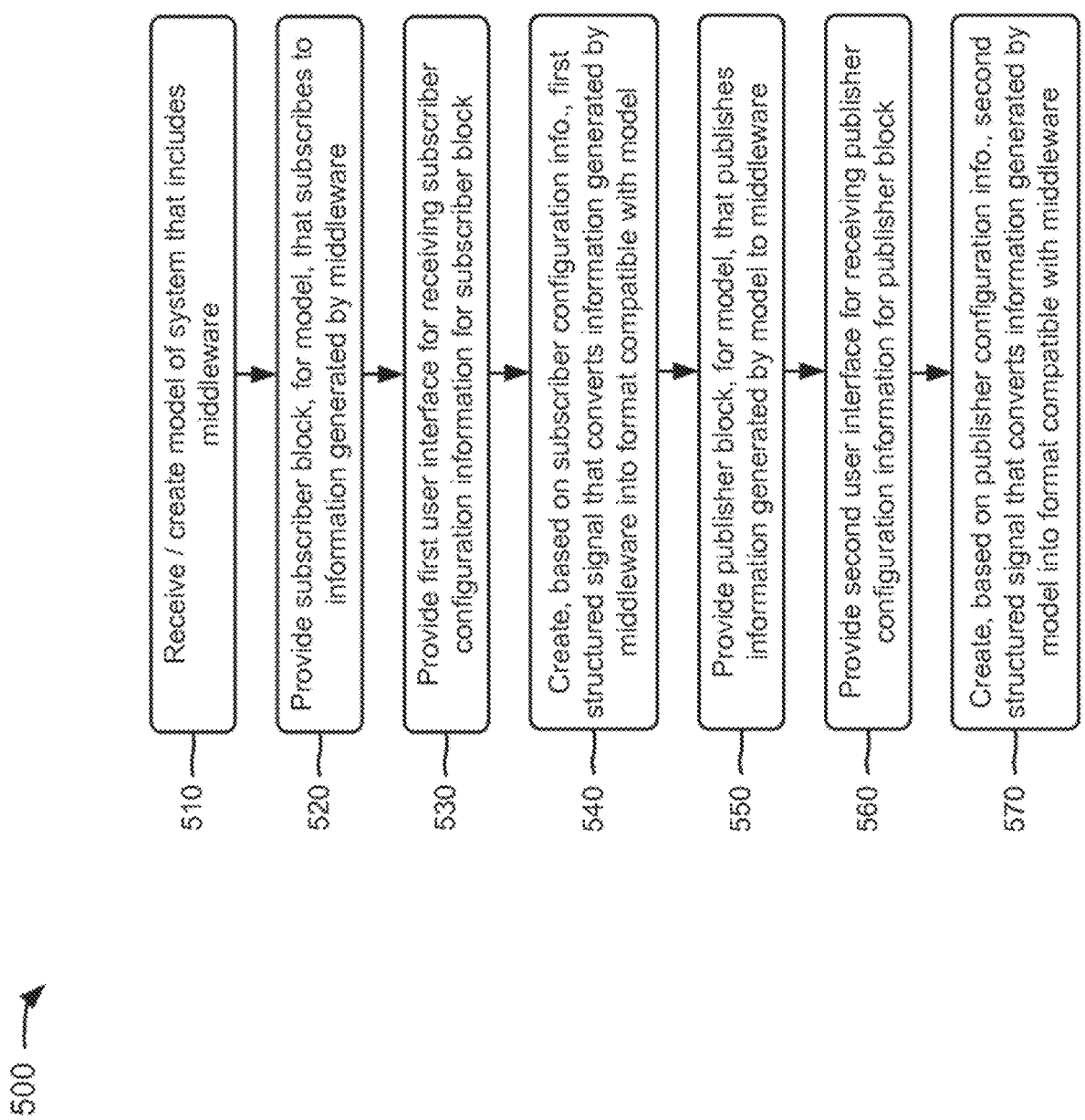

EXCHANGING INFORMATION AMONG SYSTEM MIDDLEWARE AND MODELS

RELATED APPLICATION

This application is a continuation of U.S. patent application Ser. No. 14/635,719, filed Mar. 2, 2015 (now U.S. Pat. No. 10,116,500), the disclosure of which is incorporated by reference herein in its entirety.

BRIEF DESCRIPTION OF THE DRAWINGS

FIG. 2 is a block diagram of an example environment in which systems and/or methods, described herein, may be implemented;

FIG. 3 is a block diagram of example components of one or more devices of FIG. 2;

FIGS. 4A-4I are block diagrams of example implementations of exchanging information between middleware of systems and models of the systems; and FIG. 5 is a flow chart of an example process for exchanging information between middleware of a system and a model of the system.

DETAILED DESCRIPTION

Figure 1:
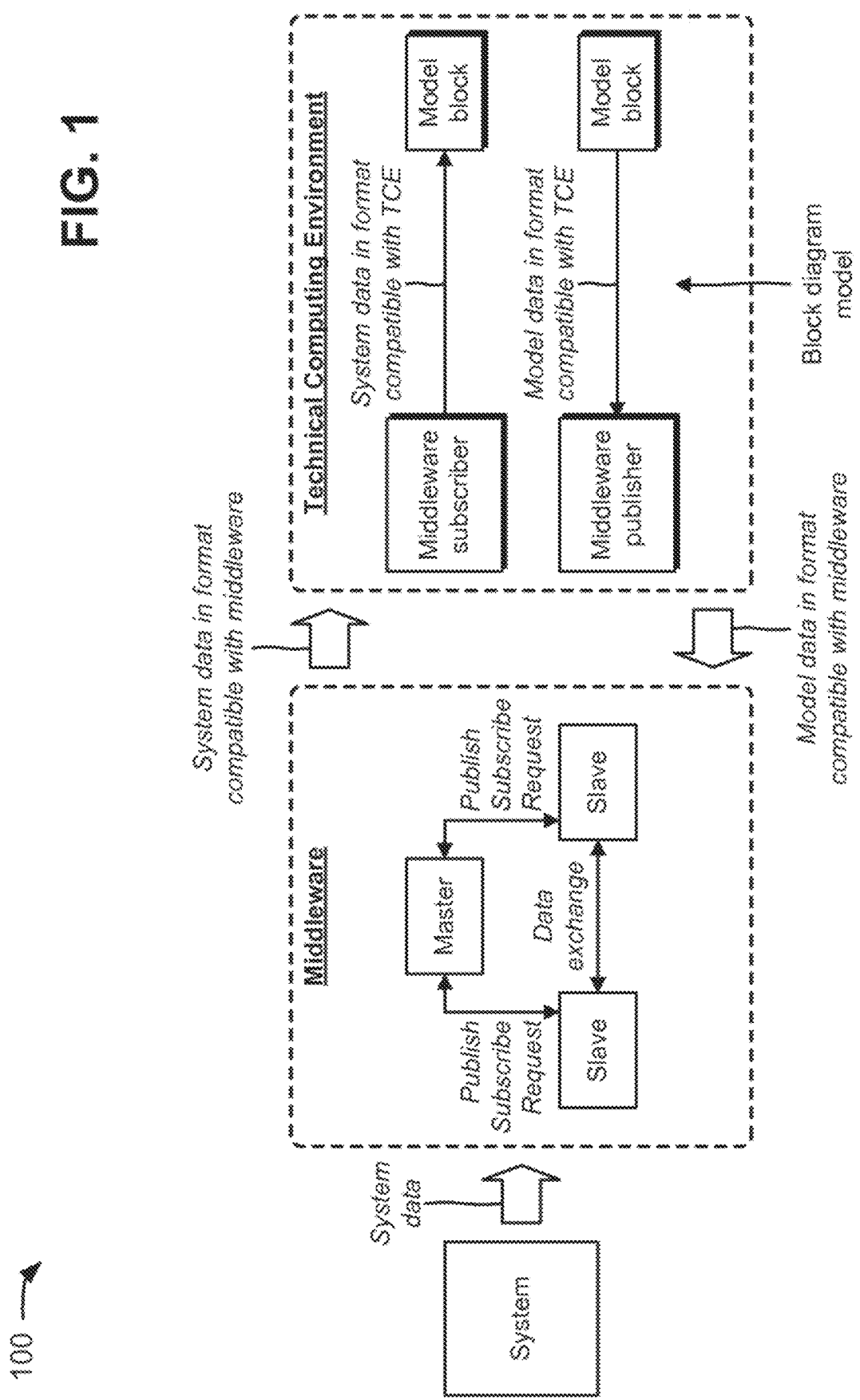
FIG. 1 is a block diagram of an example implementation described herein.

The following detailed description of example implementations refers to the accompanying drawings. The same reference numbers in different drawings may identify the same or similar elements.

Behavior of a system, such as, for example, an information system (e.g., a digital control system, a signal processing system, or the like); a technical system (e.g., an airplane wing system); a natural system (e.g., a human organ, a plant, or the like); a physical system (e.g., a bouncing ball); or the like, can be simulated using one or more models executed on a device. The system can interact with its corresponding models through software, e.g., middleware, stored and executed on a device associated with the system or another device. For simplicity of the description below, such software is referred to as middleware, although the description applies to any type of software having the features described below. Implementations, described herein, may allow the models, to automatically access data communicated on the middleware. The implementations may not be tied to a specific communication protocol and may be adapted to different types of data generated by the middleware.

A system may include hardware and software operating on the hardware. The software may include an operating system that executes on the hardware and controls the behavior of the hardware. The system may include middleware that provides services to software applications beyond those available from the operating system. The middleware may be implemented in different forms of hardware (e.g., a network of processors), firmware, or a combination of hardware and software. The middleware may include a master and multiple slaves controlled by the master. The master may maintain a registry of the multiple slaves, and a registry of data (e.g., topics) provided (e.g., published) by the multiple slaves and/or received (e.g., subscribed to) by the multiple slaves. Each slave may publish data for a topic(s) (e.g., camera data, robotic data, or the like), and provide the data to other slaves. Each slave may subscribe to data for a topic(s), and receive the data from another slave. Each slave may request service(s) (e.g., a remote procedure call) from another slave, and may receive the service(s) via a response from the other slave. The multiple slaves may perform such functions after initiation by the master, and/or may perform such functions directly with other slaves.

A device, such as a computer, may receive or generate a model of a system. The model may include a set of model elements that, when executed, simulates behavior of the system. The model elements may correspond to physical elements of the system and may, when executed, simulate the behavior of the physical elements. For example, the model may include a block diagram model with one or more blocks (e.g., model elements) that represent an operation of a component of the system. The blocks may be connected via one or more connector lines (e.g., lines for carrying a signal associated with the blocks). One or more parameters may describe the behavior of a block in the context of the block diagram model, and may influence a manner in which the block behaves, when executed.

The model may communicate with the system via the middleware. Implementations, described herein, may allow the model to automatically access data communicated on the middleware. The implementations may not be tied to a specific communication protocol and may be adapted to different types of data (e.g., topics) generated by the middleware. Communications with middleware can be performed using different, incompatible communication protocols and different types of data.

FIG. 1 is a block diagram of an example implementation 100 described herein. Example implementation 100 may be performed by a device (now shown), such as a computer, that includes a technical computing environment (TCE) and that communicates with a system via middleware. The TCE may include any hardware-based component or a combination of hardware and software-based components that provides a computing environment that allows tasks to be performed related to disciplines, such as, but not limited to, mathematics, science, engineering, medicine, and business.

As shown in FIG. 1, the device (e.g., via the TCE) may receive a block diagram model or may create the block diagram model for simulating a system. The system may be associated with and communicate system data (e.g., camera data, robotic data, communication protocols, system parameters, or the like) to middleware. The middleware may include a master and, in some implementations, multiple slaves may be controlled by the master. In some implementations, the master may provide configuration information (e.g., parameters for the system, parameters for the middleware, communication protocols, or the like) to the multiple slaves, and may be used to configure communication between the multiple slaves after the multiple slaves have been configured (e.g., where the multiple slaves may exchange information directly instead of having to pass the information through the master). Each slave may publish (e.g., generate) data for topics associated with the system data (e.g., when the system data is generated), and provide the topic data to other slaves. Each slave may subscribe to (e.g., request) data for topics associated with the system data, and receive the topic data from another slave. Each slave may request services (e.g., remote procedure calls) from another slave, and may receive the services via a response from the other slave. As further shown in FIG. 1, the middleware may provide the system data, in a format compatible with the middleware, to the block diagram model. The system data may include the system data provided by the system, the topic data exchanged by the slaves, information associated with services exchanged by the slaves, or the like. The format of the system data may be incompatible with the model (e.g., data types may be different so that the model cannot read data directly from the system, and the system cannot read data directly from the model). In some implementations, the user may be asked to resolve an incompatible data type into a format that that the model can read. In such implementations, a conversion may be utilized, such as converting from a double floating point representation to a fixed point representation or from a two-dimensional array to a one-dimensional array (e.g., either in a row major or a column major form). Furthermore, an error or a warning may be displayed to the user in such implementations.

The model may include one or more blocks simulating one or more portions of the system, and the TCE may provide a user of the model with access to a middleware subscriber block and a middleware publisher block. In some implementations, the middleware subscriber block and the middleware publisher block are inserted into the model based on a user's request. The middleware subscriber block can be configured in the TCE to receive system data from the middleware. For example, the middleware subscriber block may receive system data (e.g., images, video, or the like) for a particular component (e.g., a camera) of the system. The middleware subscriber block may receive the system data, for the particular component, from the middleware, and may convert the system data into a format (e.g., a numeric array, a character array, a table, a structure, a cell array, or the like) compatible with the TCE and the block diagram model. The middleware subscriber block may then provide the converted system data to the block diagram model.

As further shown in FIG. 1, the middleware publisher block may provide particular model data (e.g., generated by the model) to the middleware. For example, the middleware publisher block may provide model data for a particular block of the model. The middleware publisher block may receive the model data from the particular block, and may convert the model data into a format compatible with the middleware and the system (e.g., common data format (CDF), flexible image transport system (FITS) files, hierarchical data format (HDF), or the like). The middleware publisher block may then provide the converted model data to the middleware. The middleware subscriber block and the middleware publisher block may enable information to be communicated between the block diagram model and the system (e.g., via the middleware).

Systems and/or methods, described herein, may allow a model and a user of the model to automatically access data communicated on middleware. The systems and/or methods may enable different types of data to be communicated between the model and a system being modeled, via the middleware.

FIG. 2 is a block diagram of an example environment 200 in which systems and/or methods, described herein, may be implemented. As shown in FIG. 2, environment 200 may include a client device 210, which may include a technical computing environment (TCE) 225. Furthermore, environment 200 may include a server device 230, which may include TCE 220, and a network 240. Devices of environment 200 may interconnect via wired connections, wireless connections, or a combination of wired and wireless connections.

Client device 210 may include a device capable of receiving, generating, storing, processing, executing, and/or providing program information, such as information associated with a model. For example, client device 210 may include a computing device, such as a desktop computer, a laptop computer, a tablet computer, a handheld computer, a server, a mobile phone (e.g., a smart phone, a radiotelephone, or the like), or a similar device. In some implementations, client device 210 may receive information from and/or provide information to server device 230.

Client device 210 may host TCE 220. Functions described herein as being performed by TCE 220 may be performed by client device 210 and execution of TCE 220 by client device 210. TCE 220 may include any hardware-based component or a combination of hardware and software-based components that provides a computing environment that allows tasks to be performed (e.g., by users) related to disciplines, such as, but not limited to, mathematics, science, engineering, medicine, and business. TCE 220 may include a text-based environment (e.g., MATLAB software; Octave; Python; Comsol Script; MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; Modelica or Dymola from Dynasim; etc.); a graphically-based environment (e.g., Simulink® software, Stateflow® software, SimEvents® software, Simscape™ software, etc., by The MathWorks, Inc.; VisSim by Visual Solutions; LabView® by National Instruments; Dymola by Dynasim; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhapsody or Tau from Telelogic; Ptolemy from the University of California at Berkeley; aspects of a Unified Modeling Language (UML) or SysML environment; etc.); or another type of environment, such as a hybrid environment that includes one or more of the above-referenced text-based environments and one or more of the above-referenced graphically-based environments.

For example, TCE 220 may provide mathematical functions and/or graphical tools (e.g., for creating plots, surfaces, images, volumetric representations, or the like). In some implementations, TCE 220 may provide these functions and/or tools using toolboxes (e.g., toolboxes for signal processing, image processing, data plotting, parallel processing, or the like). In some implementations, TCE 220 may provide these functions as block sets or in another way, such as via a library, a local or remote database (e.g., a database operating in a computing cloud), remote procedure calls ("RPCs"), an application programming interface ("API"), or the like.

TCE 220 may include a modeling system that may be used in the creation of a functional model and that may enable generation of executable code based on the model. For example, TCE 220 may include a graphical modeling tool or application that provides a user interface for a numerical computing environment. Additionally, or alternatively, TCE 220 may include a graphical modeling tool and/or application that provides a user interface for modeling and simulating (e.g., by executing a model) a dynamic system (e.g., based on differential equations, difference equations, discrete events, discrete states, or the like). Execution of a model to simulate a system may also be referred to as simulating a model. The model may further include static relations (e.g., algebraic relations, stochastic relations, inequalities, or the like).

In some implementations, the model may include a block diagram model. The block diagram model may include one or more blocks (e.g., model elements) that represent an operation of a component of a system (e.g., the sensor, the camera, or the like) or that interact or communicate with components of the system. The blocks may be connected via one or more connector lines (e.g., lines for carrying a signal associated with the blocks). A parameter may describe the behavior of a block in the context of the block diagram model, and may influence a manner in which the block behaves, when executed. For example, the parameter may identify an input to the block (and/or a system represented by the block), an output from the block, a manner in which the input is processed by the block, a manner in which the output is generated by the block, a state associated with the block, and/or other information that describes a behavior of the block.

In some implementations, the block diagram model may be represented graphically, textually, and/or stored in some form of internal representation. For example, a particular visual depiction may be used to represent the block, such as in a graphical model (e.g., a graphical block diagram).

In some implementations, the graphical model may include entities with relationships between the entities, and the relationships and/or the entities may be associated with attributes. The entities may include model elements, such as blocks and/or ports. The relationships may include model elements, such as lines (e.g., connector lines) and references (e.g., textual labels). The attributes may include value information and meta information for the model element associated with the attributes. In some implementations, the graphical model may be associated with configuration information. The configuration information may include information for the graphical model, such as model execution information (e.g., numerical integration schemes, fundamental execution period, or the like), model diagnostic information (e.g., whether an algebraic loop should be considered an error or result in a warning), model optimization information (e.g., whether model elements should share memory during execution), model processing information (e.g., whether common functionality should be shared in code that is generated for a model), or the like.

In some implementations, the graphical model may have executable semantics and/or may be executable. An executable graphical model may be a time based block diagram. A time based block diagram may include, for example, blocks connected by lines (e.g., connector lines). The blocks may include elemental dynamic systems, such as a differential equation system (e.g., to specify continuous-time behavior), a difference equation system (e.g., to specify discrete-time behavior), an algebraic equation system (e.g., to specify constraints), a state transition system (e.g., to specify finite state machine behavior), an event based system (e.g., to specify discrete event behavior), or the like. The lines may represent signals (e.g., to specify input/output relations between blocks or to specify execution dependencies between blocks), variables (e.g., to specify information shared between blocks), physical connections (e.g., to specify electrical wires, pipes with volume flow, rigid mechanical connections, or the like), or the like. The attributes may include meta information, such as sample times, dimensions, complexity (whether there is an imaginary component to a value), data type, or the like, associated with the model elements.

In a time based block diagram, ports may be associated with blocks. A relationship between two ports may be created by connecting a line (e.g., a connector line) between the two ports. Lines may also, or alternatively, be connected to other lines, for example by creating branch points. For instance, three or more ports can be connected by connecting a line to each of the ports, and by connecting each of the lines to a common branch point for all of the lines. A common branch point for the lines that represent physical connections may be a dynamic system (e.g., by summing all variables of a certain type to zero or by equating all variables of a certain type). A port may be an input port, an output port, a non-causal port, an enable port, a trigger port, a function-call port, a publish port, a subscribe port, an exception port, an error port, a physics port, a power port, an entity flow port, a data flow port, a control flow port, or the like.

Relationships between blocks may be causal and/or non-causal. For example, a model (e.g., a functional model) may include a block that represents a continuous-time integration block that may be causally related to a data logging block by using a line (e.g., a connector line) to connect an output port of the continuous-time integration block to an input port of the data logging block. Further, during execution of the model, the value stored by the continuous-time integrator may change as the current time of the execution progresses. The value of the state of the continuous-time integrator may be available on the output port and the connection with the input port of the data logging block may make this value available to the data logging block.

In one example, a block may include or otherwise correspond to a non-causal modeling function or operation. An example of a non-causal modeling function may include a function, operation, or equation that may be executed in different fashions depending on one or more inputs, circumstances, and/or conditions. Put another way, a non-causal modeling function or operation may include a function, operation, or equation that does not have a predetermined causality. For instance, a non-causal modeling function may include an equation (e.g., $X=2Y$) that can be used to identify the value of one variable in the equation (e.g., "X") upon receiving an assigned value corresponding to the other variable (e.g., "Y"). Similarly, if the value of the other variable (e.g., "Y") were provided, the equation could also be used to determine the value of the one variable (e.g., "X").

Assigning causality to equations may include determining which variable in an equation is computed by using that equation. Assigning causality may be performed by sorting algorithms, such as a Gaussian elimination algorithm. The result of assigning causality may be a lower block triangular matrix that represents the sorted equations with strongly connected components representative of algebraic cycles or loops. Assigning causality may be part of model compilation.

Equations may be provided in symbolic form. A set of symbolic equations may be symbolically processed to, for example, produce a simpler form. To illustrate, a system of two equations $X=2Y+U$ and $Y=3X-2U$ may be symbolically processed into one equation $5Y=-U$. Symbolic processing of equations may be part of model compilation.

As such, a non-causal modeling function may not, for example, require a certain input or type of input (e.g., the value of a particular variable) in order to produce a valid output or otherwise operate as intended. Indeed, the operation of a non-causal modeling function may vary based on, for example, circumstance, conditions, or inputs corresponding to the non-causal modeling function. Consequently, while the description provided above generally describes a directionally specific or consistent signal flow between blocks, in other implementations, the interactions between blocks may not necessarily be directionally specific or consistent.

In some implementations, connector lines in a model may represent related variables that are shared between two connected blocks. The variables may be related such that their combination may represent power. For example, connector lines may represent voltage, current, power, etc. In some implementations, the signal flow between blocks may be automatically derived.

In some implementations, one or more blocks may also, or alternatively, operate in accordance with one or more rules or policies corresponding to a model in which they are included. For instance, if the model were intended to behave as an actual, physical system or device, such as an electronic circuit, the blocks may be required to operate within, for example, the laws of physics (also referred to herein as "physics-based rules"). These laws of physics may be formulated as differential and/or algebraic equations (e.g., constraints, etc.). The differential equations may include derivatives with respect to time, distance, and/or other quantities, and may be ordinary differential equations (ODEs), partial differential equations (PDEs), and/or differential and algebraic equations (DAEs). Requiring models and/or model components to operate in accordance with such rules or policies may, for example, help ensure that simulations based on such models will operate as intended.

A sample time may be associated with the elements of a graphical model. For example, a graphical model may include a block with a continuous sample time such as a continuous-time integration block that may integrate an input value as time of execution progresses. This integration may be specified by a differential equation. During execution, the continuous-time behavior may be approximated by a numerical integration scheme that is part of a numerical solver. The numerical solver may take discrete steps to advance the execution time, and these discrete steps may be constant during an execution (e.g., fixed step integration) or may be variable during an execution (e.g., variable-step integration).

In some implementations, a graphical model may include a block with a discrete sample time such as a unit delay block that may output values of a corresponding input after a specific delay. This delay may be a time interval and this interval may determine a sample time of the block. During execution, the unit delay block may be evaluated each time the execution time has reached a point in time where an output of the unit delay block may change. These points in time may be statically determined based on a scheduling analysis of the graphical model before starting execution.

In some implementations, a graphical model may include a block with an asynchronous sample time, such as a function-call generator block that may schedule a connected block to be evaluated at a non-periodic time. During execution, a function-call generator block may evaluate an input and when the input attains a specific value when the execution time has reached a point in time, the function-call generator block may schedule a connected block to be evaluated at this point in time and before advancing execution time.

Further, the values of attributes of a graphical model may be inferred from other elements of the graphical model or attributes of the graphical model. The inferring may be part of a model compilation. For example, the graphical model may include a block, such as a unit delay block, that may have an attribute that specifies a sample time of the block. When a graphical model has an execution attribute that specifies a fundamental execution period, the sample time of the unit delay block may be inferred from this fundamental execution period.

As another example, the graphical model may include two unit delay blocks where the output of the first of the two unit delay blocks is connected to the input of the second of the two unit delay block. The sample time of the first unit delay block may be inferred from the sample time of the second unit delay block. This inference may be performed by propagation of model element attributes such that after evaluating the sample time attribute of the second unit delay block, a graph search proceeds by evaluating the sample time attribute of the first unit delay block since it is directly connected to the second unit delay block.

The values of attributes of a graphical model may be set to characteristic settings, such as one or more inherited settings, one or more default settings, etc. For example, the data type of a variable that is associated with a block may be set to a default such as a double. Because of the default setting, an alternate data type (e.g., a single, an integer, a fixed point, etc.) may be inferred based on attributes of elements that the graphical model comprises (e.g., the data type of a variable associated with a connected block) and/or attributes of the graphical model. As another example, the sample time of a block may be set to be inherited. In case of an inherited sample time, a specific sample time may be inferred based on attributes of elements that the graphical model comprises and/or attributes of the graphical model (e.g., a fundamental execution period).

Server device 230 may include one or more devices capable of receiving, generating, storing, processing, and/or providing information, such as information associated with a model. For example, server device 230 may include a computing device, such as a server, a desktop computer, a laptop computer, a tablet computer, or a similar device. In some implementations, server device 230 may host TCE 220. In some implementations, client device 210 may be used to access one or more TCEs 220 running on one or more server devices 230. For example, multiple server devices 230 may be used to execute program code (e.g., serially or in parallel), and may provide respective results of executing the program code to client device 210.

In some implementations, client device 210 and server device 230 may be owned by different entities. For example, an end user may own client device 210, and a third party may own server device 230. In some implementations, server device 230 may include a device operating in a cloud computing environment. In this way, front-end applications (e.g., a user interface) may be separated from back-end applications (e.g., program code execution). Additionally, or alternatively, server device 230 may perform one, more, or all operations described elsewhere herein as being performed by client device 210.

Network 240 may include one or more wired and/or wireless networks. For example, network 240 may include a cellular network, a public land mobile network (PLMN), a local area network (LAN), a wide area network (WAN), a metropolitan area network (MAN), a telephone network (e.g., the Public Switched Telephone Network (PSTN)), an ad hoc network, an intranet, the Internet, a fiber optic-based network, a private network, a cloud computing network, and/or a combination of these or other types of networks.

The number and arrangement of devices and networks shown in FIG. 2 are provided as an example. In practice, there may be additional devices and/or networks, fewer devices and/or networks, different devices and/or networks, or differently arranged devices and/or networks than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of environment 200 may perform one or more functions described as being performed by another set of devices of environment 200.

FIG. 3 is a block diagram of example components of a device 300. Device 300 may correspond to client device 210 and/or server device 230. In some implementations, client device 210 and/or server device 230 may include one or more devices 300 and/or one or more components of device 300. As shown in FIG. 3, device 300 may include a bus 310, a processor 320, a memory 330, a storage component 340, an input component 350, an output component 360, and a communication interface 370.

Bus 310 may include a component that permits communication among the components of device 300. Processor 320 is implemented in hardware, firmware, or a combination of hardware and software. Processor 320 may include a processor (e.g., a central processing unit (CPU), a graphics processing unit (GPU), an accelerated processing unit (APU), or the like), a microprocessor, and/or any processing component (e.g., a field-programmable gate array (FPGA), an application-specific integrated circuit (ASIC), or the like) that interprets and/or executes instructions, and/or that is designed to implement one or more computing tasks. In some implementations, processor 320 may include multiple processor cores for parallel computing. Memory 330 may include a random access memory (RAM), a read only memory (ROM), and/or another type of dynamic or static storage device (e.g., a flash memory, a magnetic memory, an optical memory, or the like) that stores information and/or instructions for use by processor 320.

Storage component 340 may store information and/or software related to the operation and use of device 300. For example, storage component 340 may include a hard disk (e.g., a magnetic disk, an optical disk, a magneto-optic disk, a solid state disk, or the like), a compact disc (CD), a digital versatile disc (DVD), a floppy disk, a cartridge, a magnetic tape, and/or another type of computer-readable medium, along with a corresponding drive. In some implementations, storage component 340 may store TCE 220.

Input component 350 may include a component that permits device 300 to receive information, such as via user input (e.g., a touch screen display, a keyboard, a keypad, a mouse, a button, a switch, a microphone, or the like). Additionally, or alternatively, input component 350 may include a sensor for sensing information (e.g., a global positioning system (GPS) component, an accelerometer, a gyroscope, an actuator, or the like). Output component 360 may include a component that provides output information from device 300 (e.g., a display, a speaker, one or more light-emitting diodes (LEDs), or the like).

Communication interface 370 may include a transceiver-like component (e.g., a transceiver, a separate receiver and transmitter, or the like) that enables device 300 to communicate with other devices, such as via a wired connection, a wireless connection, or a combination of wired and wireless connections. Communication interface 370 may permit device 300 to receive information from another device and/or provide information to another device. For example, communication interface 370 may include an Ethernet interface, an optical interface, a coaxial interface, an infrared interface, a radio frequency (RF) interface, a universal serial bus (USB) interface, a Wi-Fi interface, a cellular network interface, or the like.

Device 300 may perform one or more processes described herein. Device 300 may perform these processes in response to processor 320 executing software instructions stored by a computer-readable medium, such as memory 330 and/or storage component 340. A computer-readable medium is defined herein as a non-transitory memory device. A memory device includes memory space within a single physical storage device or memory space spread across multiple physical storage devices.

Software instructions may be read into memory 330 and/or storage component 340 from another computer-readable medium or from another device via communication interface 370. When executed, software instructions stored in memory 330 and/or storage component 340 may cause processor 320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 3 are provided as an example. In practice, device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

Figure 4B:
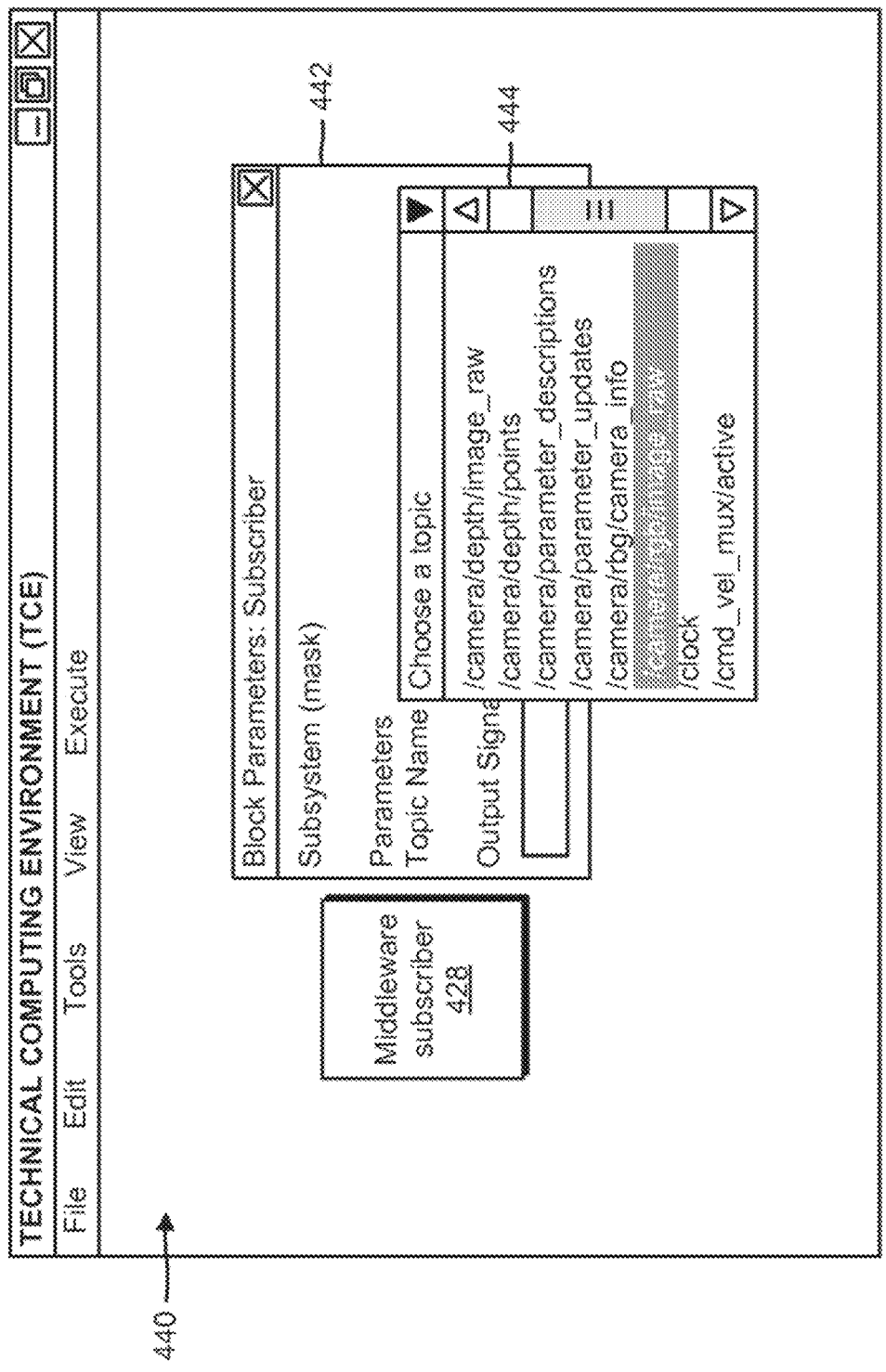

FIGS. 4A-4I are block diagrams of example implementations 400 of exchanging information between middleware of systems and models of the systems. In some implementations, the model may be of another system separate from the system, a portion of the system or the other system, a connected system to the system or the other system, or the like. As shown in FIG. 4A, a robotic system 402 may include a sensor, a camera, a joint position monitor, and/or a motor. The sensor may measure movement of robotic system 402, such as movement of a robotic arm. The camera may record video of robotic system 402, surroundings of robotic system 402, or the like. The joint position monitor may measure a joint position of a component (e.g., a robotic arm) of robotic system 402. The sensor, the camera, and the joint position monitor may output the measured information as system data 404. The motor may control operation of components of robotic system 402, such as the sensor, the camera, the joint position monitor, or the like. Although FIGS. 4A-4I are described in connection with robotic system 402, implementations, described herein, may be utilized with another type of system, such as, for example, an information system (e.g., a digital control system, a signal processing system, or the like); a technical system (e.g., an airplane wing system); a natural system (e.g., human organ, a plant, or the like); a physical system (e.g., a bouncing ball); or the like.

Referring to FIG. 4A, robotic system 402 may be associated with and communicate system data 404 to middleware 410. In some implementations, middleware 410 may include a Robot Operating System (ROS), Open®-aist, robot software communications architecture (RSCA), or other middleware capable of communicating with robotic system 402. Middleware 410 may be implemented in different forms of hardware, firmware, or a combination of hardware and software. Middleware 410 may include multiple slaves, such as a data publisher 412 and a data subscriber 414. Data publisher 412 may publish (e.g., generate) data for topics associated with system data 404, and may provide the topic data to other slaves. Data subscriber 414 may subscribe to (e.g., request) data for topics associated with system data 404, and may receive the topic data from another slave. As further shown in FIG. 4A, data publisher 412 may provide system data 404, in a format compatible with middleware 410, to model 420, as indicated by reference number 416. System data 416 may include system data 404 provided by robotic system 402, the topic data exchanged by data publisher 412 and data subscriber 414, information associated with services exchanged by data publisher 412 and data subscriber 414, or the like.

With reference to FIG. 4A, assume that client device 210 (e.g., via TCE 220) receives model 420 or creates model 420 based on robotic system 402. In some implementations, client device 210 may receive model 420 from a storage device (e.g., memory 330 and/or storage component 340, FIG. 3). In some implementations, model 420 may be stored in a data structure associated with client device 210, and client device 210 may receive model 420 by accessing the data structure. In some implementations, the operations described in connection with FIGS. 4A-4I may be performed by another device or a group of devices separate from or including client device 210, such as server device 230.

In some implementations, model 420 may include a set of model elements that, when executed on client device 210, simulates behavior of robotic system 402. For example, robotic system 402 may include a set of physical elements that correspond to portions and/or components of robotic system 402. Robotic system 402 may be a dynamic system that changes its state, for example, as time progresses. The model elements may correspond to physical elements and may, when executed, simulate the behavior of the physical elements and/or robotic system 402. In some implementations, the model elements may correspond to information elements, such as digital control signals, digital signal processing information, or the like.

In example implementation 400, assume that model 420 includes one or more blocks, such as an image conversion block 422, a video viewer block 424, and other blocks 426. Image conversion block 422 may convert image information (e.g., received from the camera of robotic system 402) into a format compatible with video viewer 424. Video viewer block 424 may receive the converted image information from image conversion block 422, and may display (e.g., via client device 210) the converted image information (e.g., as an image, a video, or the like) to a user of model 420.

In some implementations, TCE 220 may enable (e.g., via client device 210) a middleware subscriber block 428 and a middleware publisher block 430 to be provided in model 410. For example, TCE 220 may include or communication with a library of blocks that includes middleware subscriber block 428 and middleware publisher block 430. Assume that the user of model 420 instructs client device 210, via TCE 220, to insert middleware subscriber block 428 and middleware publisher block 430 into model 420. In some implementations, middleware subscriber block 428 may be configured to receive particular system data 416 from middleware 410, as described below. For example, middleware subscriber block 428 may be configured to receive system data 416 (e.g., subscribed to data) associated with the camera of robotic system 402, and to convert system data 416 into a format compatible with model 420.

In some implementations, middleware publisher block 430 may be configured to provide particular model data (e.g., control data 432 generated by model 420) to middleware 410, as described below. For example, middleware publisher block 430 may be configured to provide control data 432 (e.g., published data), in a format compatible with middleware 410, to data subscriber 414 of middleware 410. In some implementations, data subscriber 414 may utilize control data 432 to control the motor of robotic system 402, which, in turn, may control other components of robotic system 402. For example, the motor may utilize control data 432 to adjust a position of the camera, move the sensor, or the like.

As shown in an example user interface 440 of FIG. 4B, the user of model 420 may utilize TCE 220 to configure middleware subscriber block 428. In some implementations, the user may configure middleware subscriber block 428 by selecting or hovering over middleware subscriber block 428 (e.g., with a selection mechanism, such as a mouse, a cursor, or the like). In some implementations, when the user selects or hovers over middleware subscriber block 428, TCE 220 may display a block parameters window 442 that enables the user to specify parameters for middleware subscriber block 428, a topic to which to subscribe from middleware 410, output signal parameters, or the like. With regard to the topic, TCE 220 may display a topic window 444 from which the user may select the topic. For example, the user may select the topic identified as "/camera/rgb/image_raw." In some implementations, topic window 444 may include information associated with topic data generated by middleware 410, such as camera image data, camera parameters, camera information, or the like. In some implementations, TCE 220 may filter information provided in topic window 444 based on a data type(s) associated with model 420. For example, TCE 220 may filter topics that do not match the data type(s) associated with model 420. In some implementations, TCE 220 may filter topics based on attributes associated with middleware subscriber block 428. For example, middleware subscriber block 428 may expect certain attributes (e.g., a certain data type, a certain type of communication, a certain sample time, a certain value range, a certain data size, a certain unit, or the like), and may filter topics based on the certain attributes. In some implementations, middleware subscriber block 428 may include a specified quality of service (QoS), such as latency, reliability, determinism, or the like, and only topics that are communicated up to the specified QoS are displayed.

Figure 4C:
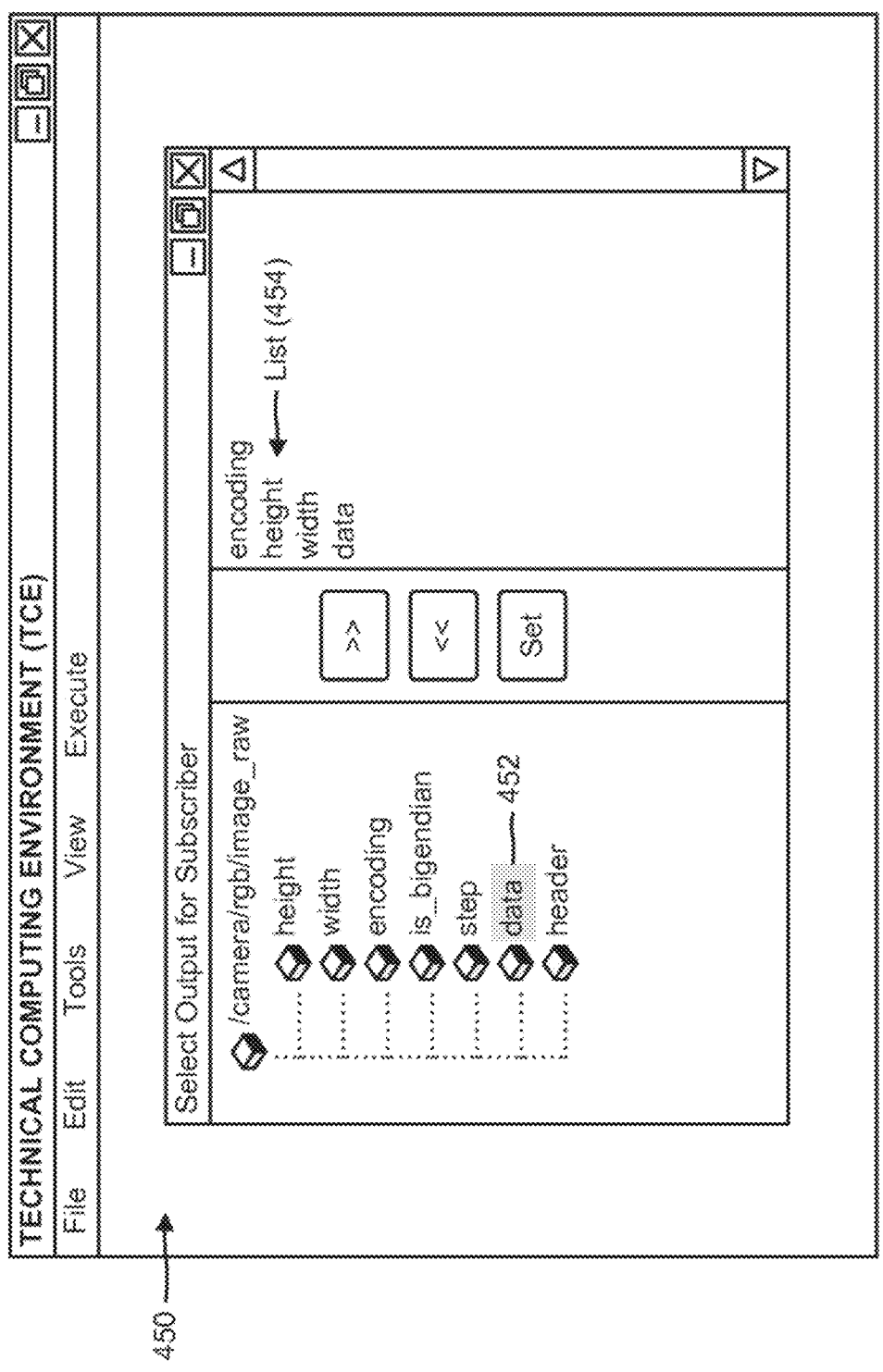

In some implementations, each topic may include multiple messages (e.g., structured data for a topic), and can have a topic structure that includes fields containing data or information of each topic. TCE 220 may display an example user interface 450 as shown in FIG. 4C for a user to extract data of a topic from selected fields. For example, user interface 450 may display a "Select Output for Subscriber" window that includes data for the selected topic (e.g., raw images captured by the camera of FIG. 4A contained in a folder "/camera/rgb/image_raw") and a list of fields, including "height," "width," "encoding," "is_bigendian," "step," "data," and "header," for the selected topic. The user may utilize user interface 450 to select which of the fields are to be made available for display in TCE 220 and model 420. For example, the user may select (e.g., with a selection mechanism, such as a mouse, a cursor, or the like) a "data" field, as indicated by reference number 452, and the "data" field may be provided in a list 454 of previously selected fields (e.g., the "encoding" field, the "height" field, and the "width" field). The fields provided in list 454 may be made available for display in TCE 220 and model 420. In some implementations, the order of the fields may correspond to how the data, associated with the fields, is made available for display in TCE 220. For example, the order of the fields may be utilized when the fields are utilized in TCE 220. Alternatively, the names of the fields may be utilized to access respective fields in TCE 220.

In some implementations, as shown in a user interface 460 of FIG. 4D, TCE 220 may utilize the fields provided in list 454 to automatically create a signal (e.g., a bus block 462) in model 420. In some implementations, bus block 462 may include data and variable dimensions. In some implementations, a topic's size of a dimension may not be provided (e.g., left unknown) and the size may not become known until subscription to (or publication of) the topic. In some implementations, the topic's dimension may change at run time, e.g., after the subscription (or the publication) has been established and as the model executes. In some implementations, a number of dimensions may be variable in a similar manner (e.g., unknown until subscription to or publication of the topic, or changed at run time).

In some implementations, data of a topic may include a size that is greater than one (e.g., the data is an array), and may include more than one dimension (e.g., in the case of a matrix or a two-dimensional array). For example, an image may include data that has two dimensions where one dimension may include a size of 640 values for 640 pixels and another dimension may include a size of 480 values for 480 pixels.

In some implementations, bus block 462 may convert system data 416 (FIG. 4A) (e.g., in the format compatible with middleware 410, such as CDF, FITS files, HDF, or the like) received by middleware subscriber block 428 into a format compatible with model 420 (e.g., a numeric array, a character array, a table, a structure, a cell array, or the like). For example, bus block 462 may convert system data 416 (e.g., the data associated with the "encoding" field, the "height" field, the "width" field, and the "data" field of list 454, FIG. 4C) into a format compatible with image conversion block 422.

In some implementations, client device 210 (e.g., via TCE 220) may receive and determine type information in published topic information, and may parse the type information. Client device 210 may potentially create a data structure for the parsed type information, and may determine data types of various fields associated with the parsed type information. Client device 210 may determine meta information from the topic information about the data, and may create a corresponding data type(s) in TCE 220. In some implementations, client device 210 (e.g., via TCE 220) may configure bus block 462 based on a selected topic of data to which bus block subscribes and/or publishes. Client device 210 may receive topic information, may read the topic information, and may parse the topic information into a data structure. The topic information may include information about data types, a quality of service allowed by the topic information, or the like. Client device 210 may utilize such information to create bus block 462 (e.g., a number of input ports, output ports, data types, dimensions, or the like for bus block 462) and to set parameters (e.g., a sample time) for bus block 462. In some implementations, the sample time may be set with middleware subscriber block 428.

In some implementations, in order to create bus block 462, TCE 220 may determine a type of topic (e.g., "/camera/rgb/image_raw") selected by the user via user interface 440 (FIG. 4B), and may read the topic via middleware subscriber block 428. For example, the selected topic may be associated with the following information:
This topic contains an uncompressed image
(0, 0) is at top-left corner of image
Header header # Header timestamp should be acquisition time of image
  # Header frame_id should be optical frame of camera
  # origin of frame should be optical center of camera
  # +x should point to the right in the image
  # +y should point down in the image
  # +z should point into the plane of the image
  # If the frame_id here and the frame_id of the CameraInfo message
  # associated with the image conflict, the behavior is undefined
uint32 height # image height, that is, number of rows
uint32 width # image width, that is number of columns
string encoding # Encoding of pixels—channel meaning, ordering, size taken from
  # the list of strings in include/sensor_msgs/image_encodings.h
uint8 is bigendian # is this data bigendian?
uint32 step # Full row length in bytes
uint8 [ ] data # actual matrix data, size is (step*rows)

In some implementations, the topic information may be provided in a repository available to middleware 410 and/or TCE 220 and associated with client device 210 and/or server device 220. In some implementations, TCE 220 may convert the selected topic information into a workspace variable (e.g., "image_msg") using the following syntax:
>>image_msg=middlewaremessage('sensor_msgs/Image')
image_msg=
  Image with properties:
    Message Type: 'sensor_msgs/Image'
    header: (1x1 middleware.msggen.std msgs.Header)
    height: 0
    width: 0
    encoding:''
    is_bigendian: 0
    step: 0
    data: [0x1 uint8]

In some implementations, TCE 220 may convert the workspace variable (e.g., "image_msg") into a format compatible with model 420 (e.g., a signal called "image_struct") using the following syntax:
>>image_struct=image_msg.toStruct
image_struct=
  height: 0
  width: 0
  encoding:''
  is_bigendian: 0
  step: 0
  data: [0x1 uint8]
  header: [1x1 struct]

Once TCE 220 creates the signal, TCE 220 may graphically present the signal to the user, via user interface 450 (FIG. 4C), so that the user may select fields of interest (e.g., the fields provided in list 454) associated with the selected topic (e.g., "/camera/rgb/image_raw"), as described above.

After the fields of interest are selected, TCE 220 may automatically populate bus block 462 with the selected fields (e.g., the "encoding" field, the "height" field, the "width" field, and the "data" field of list 454, FIG. 4C), as shown in FIG. 4D. As further shown in FIG. 4D, bus block 462 may provide information associated with the selected fields to image conversion block 422 (e.g., in a format compatible with image conversion block 422). In some implementations, image conversion block 422 may convert the information associated with the selected fields into a format compatible with video viewer block 424. For example, image conversion block 422 may convert the information associated with the selected fields into a composite "image"

signal compatible with a format used by video viewer block 424, and may provide the composite "image" signal to video viewer block 424.

In some implementations, the functions described above for bus block 464 and image conversion block 422 may be performed by middleware subscriber block 428. For example, middleware subscriber block 428 may convert system data 416 (e.g., in the format compatible with middleware 410) into information associated with the selected fields (e.g., in the format compatible with model 420). Middleware subscriber block 428 may convert the information associated with the selected fields into a composite "image" signal compatible with a format used by video viewer block 424. In some implementations, the functions described above for image conversion block 422 may be performed by middleware subscriber block 428. For example, middleware subscriber block 424 may receive the information associated with the selected fields from bus block 462, and may convert the information associated with the selected fields into a composite "image" signal compatible with a format used by video viewer block 424. In some implementations, repository information for a topic may be processed by TCE 220 and used to automatically configure middleware subscriber block 428, middleware publisher block 430, and/or bus block 462.

Figure 4E:
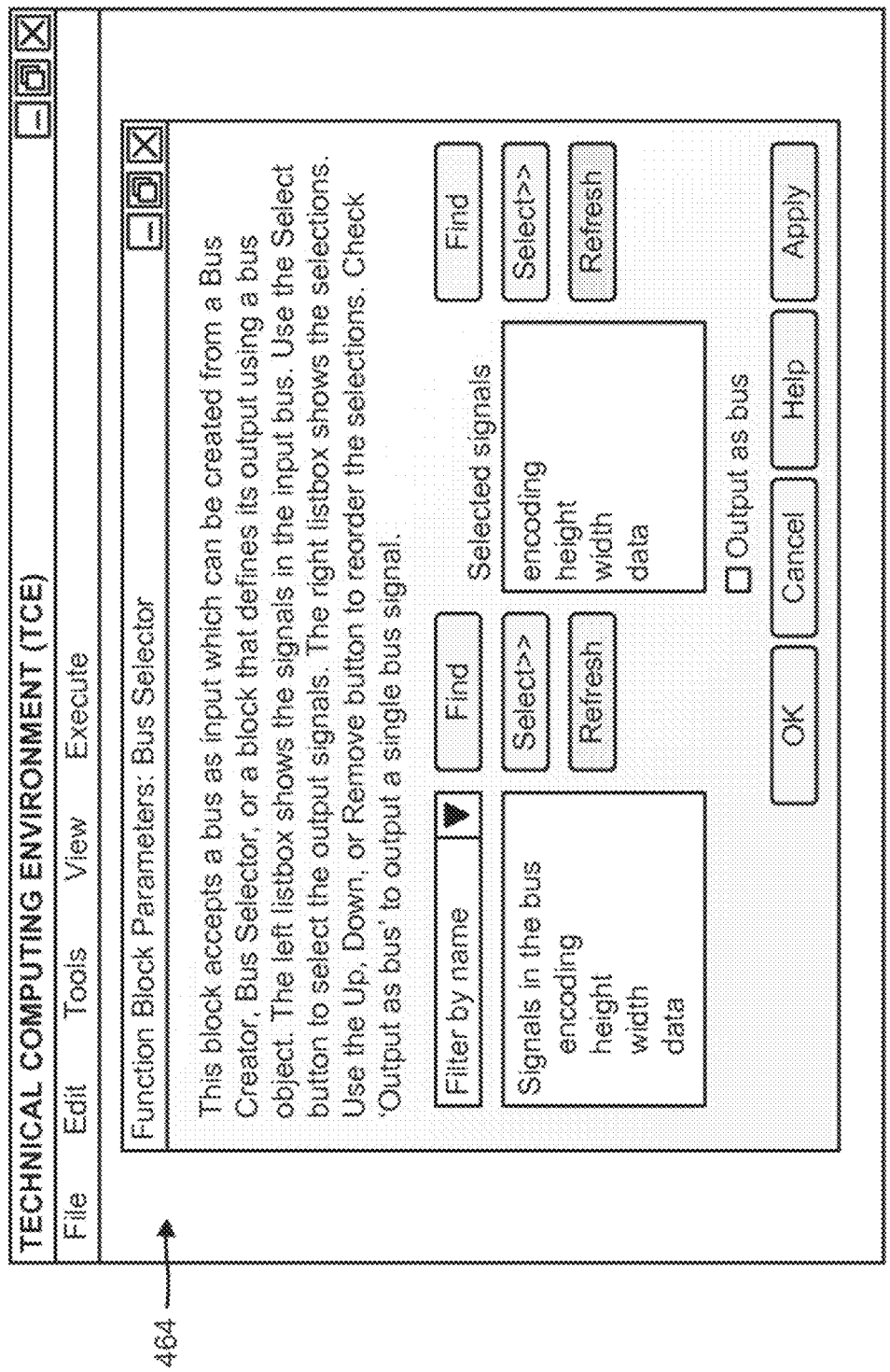

In some implementations, bus block 462 can be configured based on a user selecting or hovering a pointer over bus block 462 (e.g., with a selection or pointing mechanism, such as a mouse, a cursor, or the like). In some implementations, when bus block 462 is selected, TCE 220 may display a user interface 464 as shown in FIG. 4E. In some implementations, user interface 464 may provide the user with direct access, in TCE 220, to the information associated with the selected fields received from middleware 410. As shown in FIG. 4E, user interface 464 may enable the user to select output signals for bus block 462 (shown in FIG. 4D) (e.g., an encoding output signal, a height output signal, a width output signal, and a data output signal) based on the information associated with the selected fields; remove output signals for bus block 462; reorder output signals for bus block 462; or the like. Once the user has configured bus block 462, via user interface 464, the user may instruct TCE 220 to implement the configuration in bus block 462 by selecting an "OK" button or an "Apply" button. Bus block 462 may convert the information associated with the selected fields (e.g., in the format compatible with middleware 410) into a format compatible with model 420, based on the configuration.

In some implementations, middleware publisher block 430 may provide particular model data (e.g., control data 432 generated by model 420) to middleware 410. For example, as shown in a user interface 470 of FIG. 4F, the user of model 420 may utilize TCE 220 to configure middleware publisher block 430. In some implementations, the user may configure middleware publisher block 430 by selecting or hovering over middleware publisher block 430 (e.g., with a selection mechanism, such as a mouse, a cursor, or the like). In some implementations, when the user selects or hovers over middleware publisher block 430, TCE 220 may display a block parameters window 472 that enables the user to specify parameters for middleware publisher block 430, a topic to publish to middleware 410, a topic name, a topic message type, or the like.

Figure 4F:
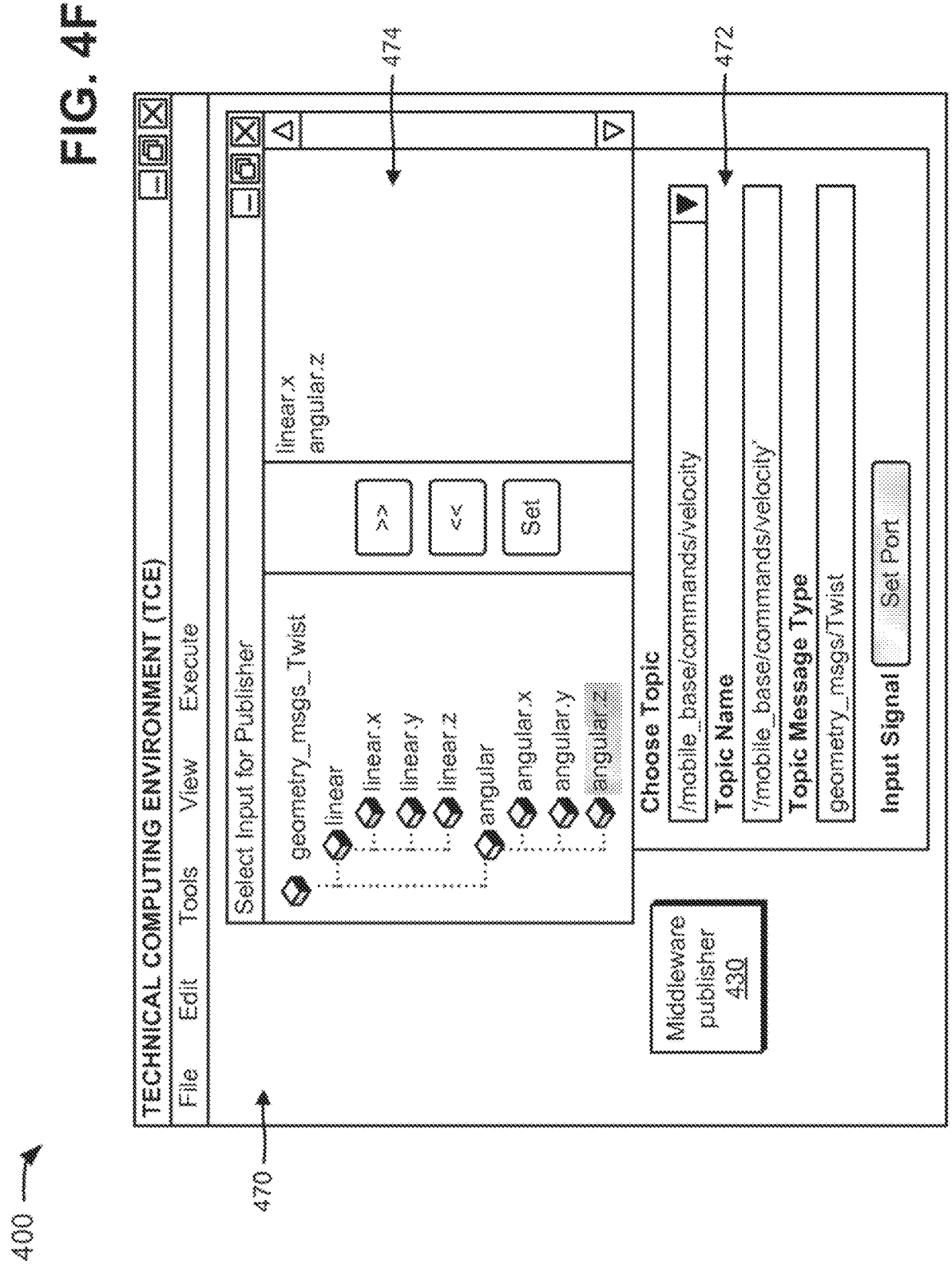
Figure 4G:
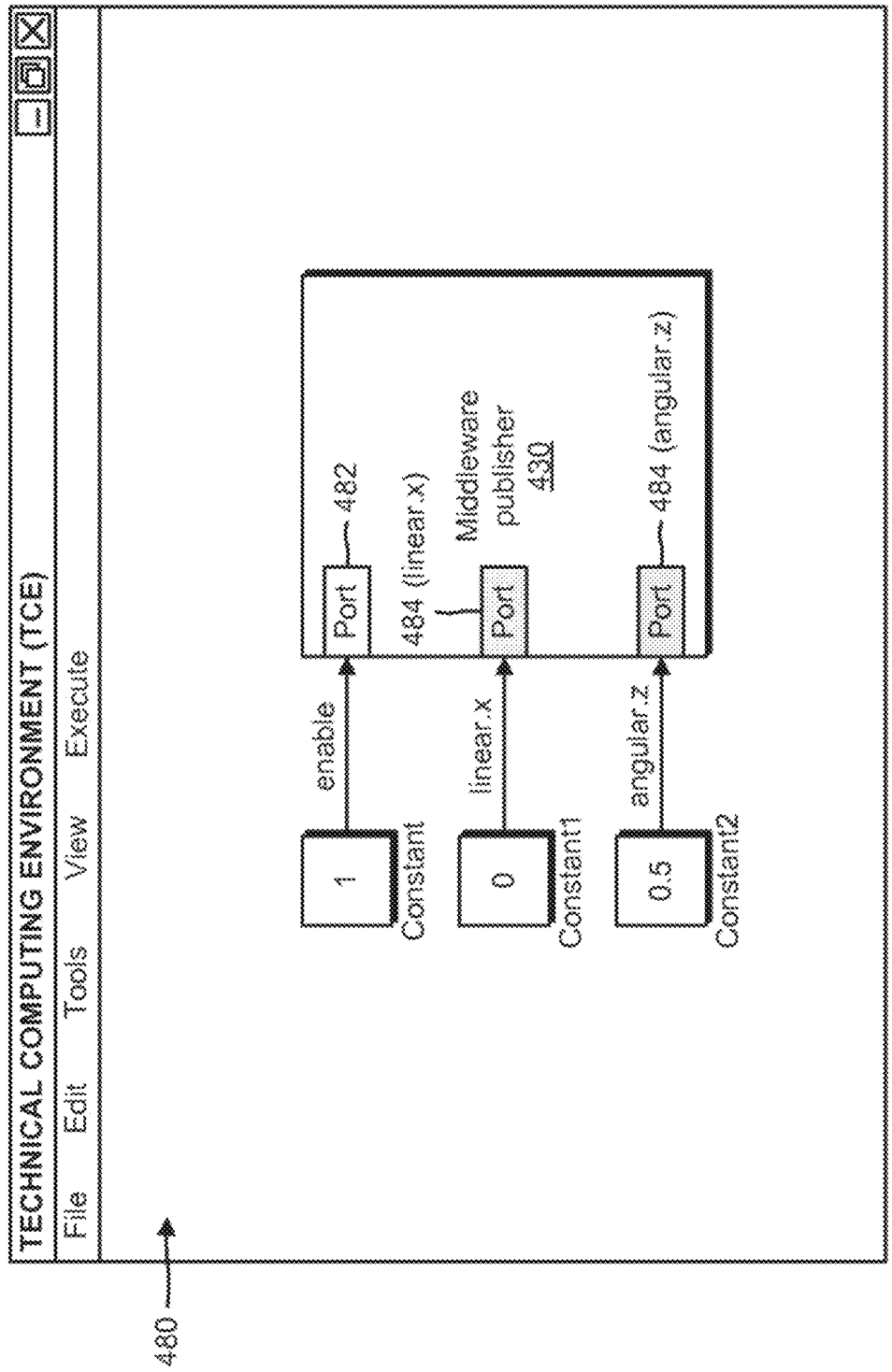
Figure 4H:
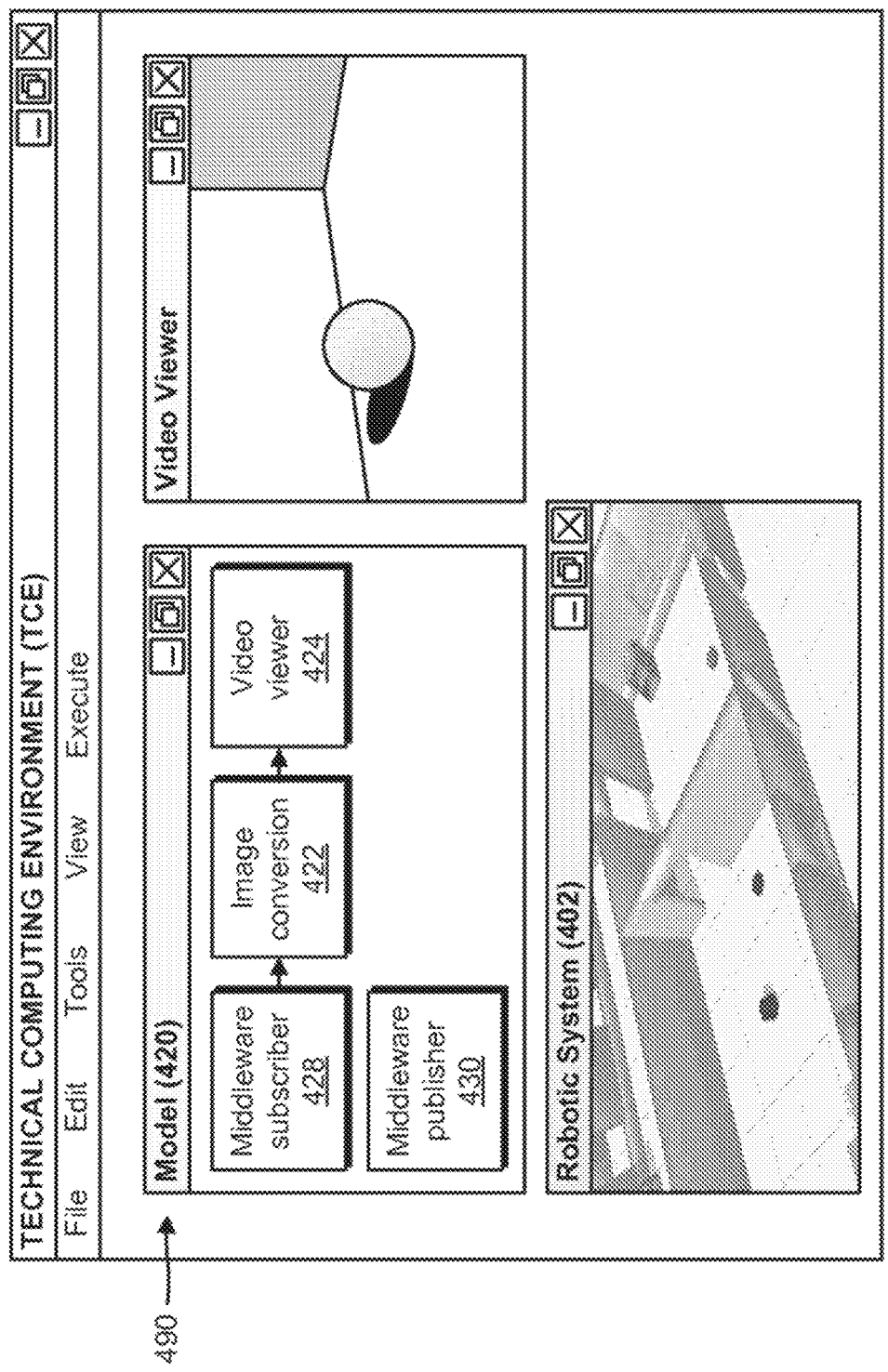

In some implementations, each topic may include multiple messages (e.g., structured data for a topic), and each topic may be organized into fields that are part of the topic structure. In order to enable the user to select specific fields of a selected topic, TCE 220 may display a publisher input window 474, as further shown in FIG. 4F. For example, publisher input window 474 may enable the user to select specific fields, of a particular selected topic (e.g., "/mobile-_base/commands/velocity"), that are set as input to middleware publisher block 430. As shown in FIG. 4F, the user may select (e.g., with a selection mechanism, such as a mouse, a cursor, or the like) a "linear.x" field and an "angular.z" field as the specific fields.

In some implementations, TCE 220 may create input ports for the specific fields so that the specific fields may be utilized as inputs to middleware publisher block 430. For example, as shown in a user interface 480 of FIG. 4G, TCE 220 may provide an enable port 482 in middleware publisher block 430 and input ports 484 for the specific fields (e.g., the "linear.x" field and the "angular.z" field). Enable port 482 may enable middleware publisher block 430 to provide particular model data (e.g., control data 432 generated by model 420) to middleware 410. In some implementations, control data 432 may include information associated with the "linear.x" field and the "angular.z" field, and middleware publisher block 430 may convert the information associated with the "linear.x" field and the "angular.z" field into a format compatible with middleware 410 and may provide the converted information to middleware 410 (e.g., to data subscriber 414, FIG. 4A).

In some implementations, if a topic does not exist in a repository available to TCE 220 and/or middleware 410, the user may utilize TCE 220 to create a new topic. In some implementations, TCE 220 may create a signal, a publisher block, or the like that converts information associated with the new topic into a format compatible with middleware 410. In some implementations, TCE 220 may store information associated with the new topic in the repository associated with TCE 220 and/or middleware 410. In some implementations, information that may be derived from a model, and included in a topic, may include field names, field data types, field dimensions, data complexity (e.g., whether there is an imaginary part), messages sample time, messages semantics (e.g., discrete time, continuous time, discrete event, or the like), execution semantics (e.g., time triggered, event triggered, synchronous, asynchronous, or the like), buffer size of a communication, structure of the data (e.g., encoding, bus elements, or the like), or the like.

In some implementations, middleware subscriber block 428 and middleware publisher block 430 may enable information to be communicated across middleware 410 directly from TCE 220 and in a format compatible with middleware 410. For example, as shown in a user interface 490 of FIG. 4H, a control and image processing model (e.g., model 420 and a video viewer window), provided by TCE 220, may be connected to a virtual world (e.g., robotic system 402) using middleware subscriber block 428 and middleware publisher block 430 in model 420 and data publisher 412 and data subscriber 414 in middleware 410.

Figure 4I:
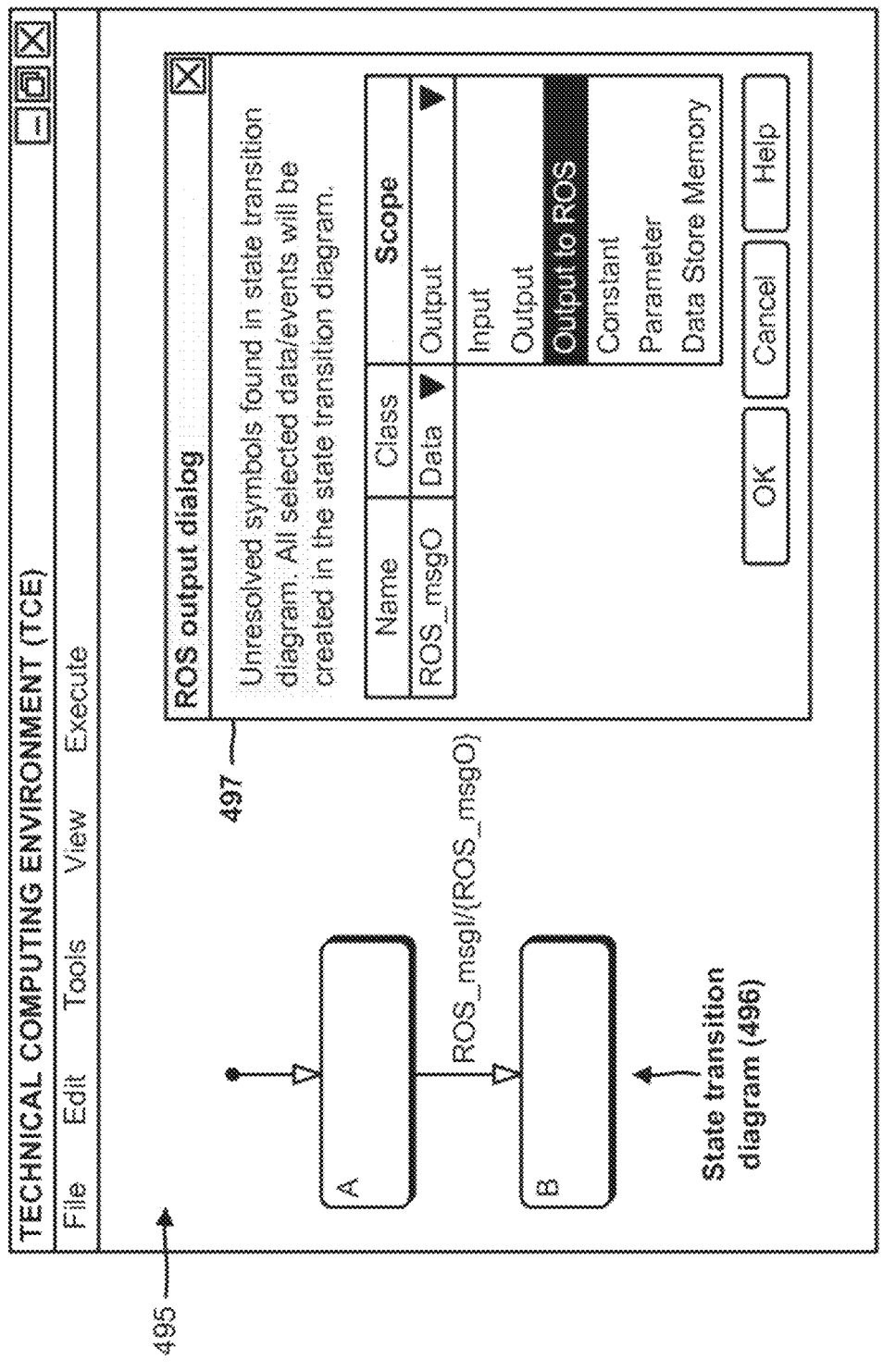

In some implementations, as shown in a user interface 495 of FIG. 4I, model 420 may be or include a state transition diagram 496. As shown, state transition diagram 496 may include two states (e.g., state A and state B) where one of the two states may be active. Upon initialization of state transition diagram 496, state A may become active, as indicated by a transition arrow with the solid circle as its source. State transition diagram 496 may subscribe to middleware 410 via a symbol (e.g., ROS_msg_I) and may publish to middleware 410 via another symbol (e.g., ROS_msgO). Such publish and/or subscribe functionalities of state transition diagram 496 may be selected by interacting with a dialog window

497 (e.g., a ROS output dialog) for setting properties of the symbols. As shown in FIG. 4I, dialog window 497 may show an example for setting properties associated with the other symbol (e.g., ROS_msgO). In this example, a pull down menu of dialog window 497 may permit selection of an "Output to ROS" option, which creates a publish interface to middleware 410. A dialog window for the subscribe functionality may provide an option, such as "Input from ROS," which creates a subscribe interface to middleware 410. After selecting a middleware publish or subscribe option, topic selection may proceed as described above in connection with FIG. 4B.

After configuring the interaction with middleware 410, state transition diagram 496 may be executed. When state transition diagram 496 is executed, state A may become active first. When a message is received from middleware 410 (e.g., via the ROS_msgI symbol), a transition may occur where state A becomes inactive and state B becomes active. This transition may occur if a message associated with ROS_msgI arrives or if a field of the message includes a specific value (e.g., a value of one, true, or the like). When the transition to state B occurs, a message may be sent to middleware 410 (e.g., via the symbol ROS_msgO). The sent message may be a default message or may include additional information (e.g., by using an argument in combination with the symbol ROS_msgO(3) or an assignment, such as ROS_msgO=3). In some implementations, specific fields in a message may be read or written, for example, using a dot notation as shown in FIG. 4F (e.g., ROS_msgO.x=3).

In some implementations, if middleware subscriber block 428 and/or middleware publisher block 430 are associated with a topic, middleware subscriber block 428 and/or middleware publisher block 430 may execute every time a message, for the topic, is received and/or sent. In some implementations, middleware subscriber block 428 and/or middleware publisher block 430 may execute with a certain sample rate so that the message may be stored before being read and/or written during execution of middleware subscriber block 428 and/or middleware publisher block 430. In some implementations, middleware subscriber block 428 and/or middleware publisher block 430 may store a number of recent messages and may read a least recently read message and/or write a least recently written message. In some implementations, a message may be discarded once the message has been read by middleware subscriber block 428. Alternatively, a message may be discarded only if a more recent message is available to middleware subscriber block 428. If no message is available, a message with default values (e.g., pre-specified values, previous values, or the like) and/or user-defined values (e.g., initial conditions) may be read by middleware subscriber block 428. In some implementations, a message may be discarded once the message has been written by middleware publisher block 430. Alternatively, a message may be discarded only if a more recent message is available to middleware publisher block 430. If no message is available, a message with default values and/or user-defined values may be written by middleware publisher block 430.

In some implementations, middleware subscriber block 428 and/or middleware publisher block 430 may discard certain messages (e.g., if messages are received at a higher rate than a rate at which middleware subscriber block 428 executes or if messages are sent at a lower rate than a rate at which middleware publisher block 430 executes). In some implementations, when middleware subscriber block 428 and/or middleware publisher block 430 execute and read/write message information, middleware subscriber block 428 and/or middleware publisher block 430 may remove/add the message information from/to a buffer. In some implementations, if middleware subscriber block 428 and/or middleware publisher block 430 execute, but a buffer from which messages are read/written is empty/full, the execution of middleware subscriber block 428 and/or middleware publisher block 430 may be stopped. Alternatively, or additionally, a default value may be read if the buffer is empty and the execution of middleware subscriber block 428 may continue. Alternatively, or additionally, if the buffer is full, middleware publisher block 430 may discard a new value (e.g., by discarding the new value or by overwriting an existing value in the buffer with the new value) and the execution of middleware publisher block 430 may continue.

In some implementations, TCE 220 and middleware 410 may determine a quality of service (e.g., a latency, a number of dropped packets, a desired data type resolution, or the like) for communications between TCE 220 (e.g., middleware subscriber block 428 and/or middleware publisher block 430) and middleware 410 (e.g., data publisher 412 and/or data subscriber 414). For example, TCE 220 or the user of TCE 220 may specify a quality of service for information received from middleware 410, a different quality of service for information provided to middleware 410, the same quality of service for information received from middleware 410 and information provided to middleware 410, or the like. In some implementations, the user may specify a quality of service, and TCE 220 may negotiate a closest matching quality of service with middleware 410. In some implementations, if data is specified to include a single resolution, but only double resolution data is available, the double resolution data may be used instead of single resolution data. In some implementations, TCE 220 may provide feedback to the user. For example, if a closest matching quality of service is found, the user may be queried as to whether the closest matching quality of service should be used, whether a number of matches that are close to the specified quality of service should be used, whether the user wishes to specify a range on quality of service characteristics, or the like.

In some implementations, if a user of a design environment (e.g., robotic system 402) selects a portion of robotic system 402, TCE 220 may automatically create a middleware subscriber block based on the selected portion of robotic system 402. For example, if the user selects a robotic hand of robotic system 402, TCE 220 may create a middleware subscriber block that receives information associated with the robotic hand (e.g., hand movement, hand position, or the like) from middleware 410, and converts the information into a format compatible with model 420.

In some implementations, if a new topic becomes available in middleware 410, middleware 410 may inform TCE 220 about the new topic. In some implementations, TCE 220 may automatically create a subscriber block that converts information associated with the new topic into a format compatible with model 420. In some implementations, TCE 220 may store information associated with the new topic in the repository associated with TCE 220 and/or middleware 410. In some implementations, a newly created block may be stored in a repository of blocks that can be used in a model (e.g., a model library). This repository may be organized into categories such that blocks associated with certain attributes may be grouped into one category (e.g., subscriber blocks, publisher blocks, blocks associated with image topics, blocks associated with motors topics, or the like).

In some implementations, middleware subscriber block 428 and middleware publisher block 430 may utilize the same or different protocols for interactions with middleware 410 (e.g., publish and subscribe, send and receive, streaming, interrupt and asynchronous, polling, or the like). In some implementations, configuration of middleware subscriber block 428 and/or middleware publisher block 430 may be established prior to run time, at run time (e.g., while middleware 410 is already running, while model 420 is already running, or the like), or the like. In some implementations, bus block 462 may perform code generation (e.g., by generating a struct in C code), and may be specified in many languages, such as XML, a C struct, a proprietary language, or the like. In some implementations, values communicated by middleware subscriber block 428 and/or middleware publisher block 430 may be numerical values, enumerations (e.g., where enumeration information may be read and processed into a workspace variable), or the like.

As indicated above, FIGS. 4A-4I are provided merely as an example. Other examples are possible and may differ from what was described with regard to FIGS. 4A-4I.

FIG. 5 is a flow chart of an example process 500 for exchanging information between middleware of a system and a model of the system. In some implementations, the model may be of another system, a portion of the system or the other system, a connected system to the system or the other system, or the like. In some implementations, one or more process blocks of FIG. 5 may be performed by client device 210. In some implementations, one or more process blocks of FIG. 5 may be performed by another device or a group of devices separate from or including client device 210, such as server device 230.

As shown in FIG. 5, process 500 may include receiving and/or creating a model of a system that includes middleware (block 510). For example, as described above in connection with FIG. 4A, client device 210 (e.g., via TCE 220) may create and/or receive model 420 that is based on robotic system 402. In some implementations, client device 210 may receive model 420 from a storage device (e.g., memory 330 and/or storage component 340, FIG. 3). In some implementations, client device 210 (e.g., TCE 220) may receive model 420 based on a user creating model 420. For example, a user may cause client device 210 to create or open a user interface. The user may then add one or more model blocks and/or model elements to the user interface to create model 420. For example, in some implementations, client device 210 may receive a command, from the user, that indicates that a model block and/or a model element is to be added to the user interface. Client device 210 may receive the command based, for example, on detecting a selection of a particular menu item, entry of a particular textual or audible input from the user, and/or entry of some other predetermined input that indicates a desire to add a model block and/or a model element to the user interface. As another example, client device 210 may receive input (e.g., a drag and drop) that indicates that a model block and/or a model element, included in a block library and/or a model element library associated with TCE 220, is to be added to the user interface. Based on the command, client device 210 may add the model block and/or the model element to the user interface. In some implementations, the model may be of another system, a portion of robotic system 402 or the other system, a connected system to robotic system 402 or the other system, or the like.

As further shown in FIG. 5, process 500 may include providing a subscriber block, for the model, that subscribes to information generated by the middleware (block 520). For example, as described above in connection with FIG. 4A, TCE 220 may provide the user of model 420 with access to middleware subscriber block 428. In some implementations, TCE 220 may provide middleware subscriber block 428 in a library of blocks that may be utilized by the user. In some implementations, the user of model 420 may instruct client device 210, via TCE 220, to insert middleware subscriber block 428 in model 420, and TCE 220 may insert middleware subscriber block 428 in model 420 based on the user's instruction. In some implementations, TCE 220 may automatically create middleware subscriber block 428 based on a portion (e.g., a publisher slave) of middleware 410 and/or based on information received from middleware 410. For example, if middleware 410 creates a new publisher slave, middleware 410 may notify TCE 220 about the new publisher slave (e.g., via an indication or a notification), and TCE 220 may automatically create middleware subscriber block 428 that corresponds to the new publisher slave.

As further shown in FIG. 5, process 500 may include receiving subscriber configuration information for the subscriber block (block 530). For example, as described above in connection with FIGS. 4B and 4C, the user of model 420 may utilize user interface 440, provided by TCE 220, to configure middleware subscriber block 428. In some implementations, the user may configure middleware subscriber block 428 by selecting or hovering over middleware subscriber block 428 (e.g., with a selection mechanism, such as a mouse, a cursor, or the like). In some implementations, when the user selects or hovers over middleware subscriber block 428, TCE 220 may display block parameters window 442 that enables the user to specify parameters for middleware subscriber block 428, a topic to which to subscribe from middleware 410, output signal parameters, or the like. With regard to the topic, TCE 220 may display topic window 444 from which the user may select the topic. For example, the user may select the topic identified as "/camera/rgb/image_raw."

In some implementations, each topic may include multiple messages (e.g., structured data for a topic), and each topic may be organized into fields that are part of the topic structure. In order to enable the user to extract data of the specific fields in a topic, TCE 220 may display user interface 450. User interface 450 may enable the user to extract data of the specific fields for the selected topic (e.g., "/camera/rgb/image_raw"), and may include a list of fields (e.g., "height," "width," "encoding," "is_bigendian," "step," "data," and "header") for the selected topic. The user may utilize user interface 450 to select which of the fields to be made available in TCE 220 and model 420. For example, the user may select (e.g., with a selection mechanism, such as a mouse, a cursor, or the like) a "data" field, as indicated by reference number 452, and the "data" field may be provided in list 454 of previously selected fields (e.g., the "encoding" field, the "height" field, and the "width" field). The fields provided in list 454 may be made available in TCE 220 and model 420. In some implementations, TCE 220 may automatically configure middleware subscriber block 428 based on configuration information received from robotic system 402. For example, robotic system 402 may provide the configuration information to TCE 220, and TCE 220 may configure middleware subscriber block 428 based on the configuration information.

As further shown in FIG. 5, process 500 may include creating, based on the subscriber configuration information, a first signal that converts information generated by the middleware into a format compatible with the model (block 540). For example, as described above in connection with FIGS. 4C and 4D, TCE 220 may utilize the fields provided in list 454 to automatically create a signal (e.g., bus block 462) in model 420. In some implementations, bus block 462 may include structured data and variable dimensions. In some implementations, bus block 462 may convert system data 416 (e.g., in the format compatible with middleware 410) received by middleware subscriber block 428 into a format compatible with model 420. For example, bus block 462 may convert system data 416 (e.g., the data associated with the "encoding" field, the "height" field, the "width" field, and the "data" field of list 454) into a format compatible with image conversion block 422.

As further shown in FIG. 5, process 500 may include providing a publisher block, for the model, that publishes information generated by the model to the middleware (block 550). For example, as described above in connection with FIG. 4A, TCE 220 may provide the user of model 420 with access to middleware publisher block 430. In some implementations, TCE 220 may provide middleware publisher block 430 in a library of blocks that may be utilized by the user. In some implementations, the user of model 420 may instruct client device 210, via TCE 220, to insert middleware publisher block 430 in model 420, and TCE 220 may insert middleware publisher block 430 in model 420 based on the user's instruction. In some implementations, TCE 220 may automatically create middleware publisher block 430 based on a portion (e.g., a subscriber slave) of middleware 410 and/or based on information received from middleware 410. For example, if middleware 410 creates a new subscriber slave, middleware 410 may notify TCE 220 about the new subscriber slave (e.g., via an indication or a notification), and TCE 220 may automatically create middleware publisher block 430 that corresponds to the new subscriber slave.

As further shown in FIG. 5, process 500 may include receiving publisher configuration information for the publisher block (block 560). For example, as described above in connection with FIG. 4F, the user may utilize TCE 220 to configure middleware publisher block 430 to provide particular model data (e.g., control data 432 generated by model 420) to middleware 410. In some implementations, the user of model 420 may utilize user interface 470, provided by TCE 220, to configure middleware publisher block 430. In some implementations, the user may configure middleware publisher block 430 by selecting or hovering over middleware publisher block 430 (e.g., with a selection mechanism, such as a mouse, a cursor, or the like). In some implementations, when the user selects or hovers over middleware publisher block 430, TCE 220 may display block parameters window 472 that enables the user to specify parameters for middleware publisher block 430, a topic to publish to middleware 410, a topic name, a topic message type, or the like.

In some implementations, each topic may include multiple messages (e.g., structured data for a topic), and each topic may be organized into fields that are part of the topic structure. In order to enable the user to select specific fields of a selected topic, TCE 220 may display publisher input window 474. In some implementations, publisher input window 474 may enable the user to select specific fields of a particular selected topic that are set as input to middleware publisher block 430, such as a "linear.x" field and an "angular.z" field.

As further shown in FIG. 5, process 500 may include creating, based on the publisher configuration information, a second signal that converts information generated by the model into a format compatible with the middleware (block 570). For example, as described above in connection with FIG. 4G, TCE 220 may create input ports for the specific fields so that the specific fields may be utilized as inputs to middleware publisher block 430. In some implementations, as shown in user interface 480, TCE 220 may provide enable port 482 in middleware publisher block 430 and input ports 484 for the specific fields (e.g., the "linear.x" field and the "angular.z" field). Enable port 482 may enable middleware publisher block 430 to provide particular model data (e.g., control data 432 generated by model 420) to middleware 410. In some implementations, control data 432 may include information associated with the "linear.x" field and the "angular.z" field, and middleware publisher block 430 may convert the information associated with the "linear.x" field and the "angular.z" field into a format compatible with middleware 410 and may provide the converted information to middleware 410.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

Systems and/or methods, described herein, provide an environment in which data, from middleware of a system, may be communicated to and used in a model of the system. The systems and/or methods may enable different types of data to be communicated between the model and a system being modeled, via the middleware. In this way, simulation of systems may be enhanced by allowing data to be seamlessly transmitted between the system and the model.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, and/or a combination of hardware and software.

Program code (sometimes referred to herein as code) is to be broadly interpreted to include text-based code that may not require further processing to execute (e.g., C++ code, Hardware Description Language (HDL) code, very-high-speed integrated circuits (VHSIC) HDL (VHDL) code, or the like), binary code that may be executed (e.g., executable files that may be directly executed by an operating system, bitstream files that may be used to configure an FPGA, or the like), text files that may be executed in conjunction with other executables (e.g., Python text files, Octave files, or the like), source code (e.g., readable by a human), machine code (e.g., readable by a machine), or the like. In some implementations, program code may include different combinations of the above-identified classes of code (e.g., text-based code, binary code, text files, source code, machine code, or the like). Additionally, or alternatively, program code may include code generated using a dynamically-typed programming language (e.g., the M language, a MATLAB® language, a MATLAB-compatible language, a MATLAB-like language, or the like) that may be used to express problems and/or solutions using mathematical notations. Additionally, or alternatively, program code may be of any type, such as a function, a script, an object, or the like.

Certain user interfaces have been described herein and/or shown in the figures. A user interface may include a graphical user interface, a non-graphical user interface, a text-based user interface, etc. A user interface may provide information for display. In some implementations, a user may interact with the information, such as by providing input via an input component of a device that provides the user interface for display. In some implementations, a user interface may be configurable by a device and/or a user (e.g., a user may change the size of the user interface, information provided via the user interface, a position of information provided via the user interface, etc.). Additionally, or alternatively, a user interface may be pre-configured to a standard configuration, a specific configuration based on a type of device on which the user interface is displayed, and/or a set of configurations based on capabilities and/or specifications associated with a device on which the user interface is displayed.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A method, comprising:
    receiving publisher configuration information for configuring a block of a model that simulates at least a portion of a system,
        the system being associated with middleware that provides one or more services to the system,
        the publisher configuration information being used to configure the block to provide information generated by the model to the middleware, and
        the receiving the publisher configuration information being performed by a device;
    executing the model to generate model data,
        the executing being performed by the device;
    creating, based on the publisher configuration information and the executing the model, converted model data associated with the block,
        the converted model data including the model data generated by the model that is converted into a format compatible with the middleware based on the publisher configuration information, and
        the creating being performed by the device; and
    providing the converted model data to the middleware for processing,
        the providing the converted model data being performed by the device.

2. The method of claim 1, where the middleware includes at least one of:
    Robot Operating System (ROS),
    Open®-aist, or
    robot software communications architecture (RSCA).

3. The method of claim 1, where the middleware includes at least one of:
    a master slave based middleware,
    a message based middleware, or
    a registry based middleware.

4. The method of claim 1, where the model data is information associated with a signal.

5. The method of claim 1, where the publisher configuration information includes:
    a topic, associated with the model data generated by the model, to provide to the middleware; and
    one or more user-selectable fields associated with the topic.

6. The method of claim 1, further comprising:
    generating the block based on an indication that the model is generating the model data.

7. The method of claim 1, where the block is provided in a repository of model blocks.

8. The method of claim 1, where the model communicates with the system via the middleware.

9. A device, comprising:
    a memory; and
    one or more processors to:
        receive publisher configuration information for configuring a block of a model that simulates at least a portion of a system,
            the system being associated with middleware that provides one or more services to the system, and
            the publisher configuration information being used to configure the block to provide information generated by the model to the middleware;
        execute the model to generate model data;
        create, based on the publisher configuration information and the executing the model, converted model data associated with the block,
            the converted model data including the model data generated by the model that is converted into a format compatible with the middleware based on the publisher configuration information; and
        provide the converted model data to the middleware for processing.

10. The device of claim 9, where the middleware includes at least one of:
    Robot Operating System (ROS),
    Open®-aist, or
    robot software communications architecture (RSCA).

11. The device of claim 9, where the middleware includes at least one of:
    a master slave based middleware,
    a message based middleware, or
    a registry based middleware.

12. The device of claim 9, where the model data is information associated with a signal.

13. The device of claim 9, where the publisher configuration information includes:
    a topic, associated with the model data generated by the model, to provide to the middleware; and one or more user-selectable fields associated with the topic.

14. The device of claim 9, where the one or more processors are further to:
generate the block based on an indication that the model is generating the model data.

15. The device of claim 9, where the block is provided in a repository of model blocks.

16. The device of claim 9, where the model communicates with the system via the middleware.

17. A non-transitory computer-readable medium storing instructions, the instructions comprising:
one or more instructions that, when executed by one or more processors, cause the one or more processors to:
receive publisher configuration information for configuring a block of a model that simulates at least a portion of a system,
the system being associated with middleware that provides one or more services to the system, and
the publisher configuration information being used to configure the block to provide information generated by the model to the middleware;
execute the model to generate model data;
create, based on the publisher configuration information and the executing the model, converted model data associated with the block,
the converted model data including the model data generated by the model that is converted into a format compatible with the middleware based on the publisher configuration information; and
provide the converted model data to the middleware for processing.

18. The non-transitory computer-readable medium of claim 17, where the middleware includes at least one of:
Robot Operating System (ROS),
Open®-aist, or
robot software communications architecture (RSCA).

19. The non-transitory computer-readable medium of claim 17, where the middleware includes at least one of:
a master slave based middleware,
a message based middleware, or
a registry based middleware.

20. The non-transitory computer-readable medium of claim 17, where the model data is information associated with a signal.

21. The non-transitory computer-readable medium of claim 17, where the publisher configuration information includes:
a topic, associated with the model data generated by the model, to provide to the middleware; and
one or more user-selectable fields associated with the topic.

22. The non-transitory computer-readable medium of claim 17, where the one or more instructions, when executed by the one or more processors, further cause the one or more processors to:
generate the block based on an indication that the model is generating the model data.

23. The non-transitory computer-readable medium of claim 17, where the model communicates with the system via the middleware.

* * * * *